(12) United States Patent
Fenney

(10) Patent No.: US 9,413,387 B2
(45) Date of Patent: Aug. 9, 2016

(54) DATA COMPRESSION USING ENTROPY ENCODING

(71) Applicant: Imagination Technologies Limited, Kings Langley (GB)

(72) Inventor: Simon Fenney, St Albans (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 14/859,043

(22) Filed: Sep. 18, 2015

(65) Prior Publication Data

US 2016/0087647 A1 Mar. 24, 2016

(30) Foreign Application Priority Data

Sep. 19, 2014 (GB) .................................. 1416592.2

(51) Int. Cl.
*H03M 7/40* (2006.01)
(52) U.S. Cl.
CPC .................................. *H03M 7/4006* (2013.01)
(58) Field of Classification Search
CPC . H03M 7/4006; H03M 7/30; H03M 13/1515; H03M 13/2936; H03M 7/3068; H03M 7/425
USPC ........................................ 341/67, 107, 50, 51
See application file for complete search history.

(56) References Cited

U.S. PATENT DOCUMENTS

| | | | | |
|---|---|---|---|---|
| 5,589,829 A * | 12/1996 | Astle | ...................... | H03M 7/425 341/106 |
| 6,195,465 B1 * | 2/2001 | Zandi | ..................... | G06F 17/148 375/E7.016 |
| 6,894,628 B2 * | 5/2005 | Marpe | ................. | H03M 7/4006 341/107 |
| 7,545,293 B2 * | 6/2009 | Reznik | ..................... | H03M 7/40 341/50 |
| 7,774,199 B2 * | 8/2010 | Pang | ................... | G10L 19/0017 704/206 |
| 2003/0169936 A1 * | 9/2003 | Zandi | ..................... | G06F 17/148 382/240 |
| 2005/0275570 A1 | 12/2005 | Wang | | |
| 2008/0111721 A1 * | 5/2008 | Reznik | ..................... | H03M 7/40 341/67 |
| 2010/0098155 A1 * | 4/2010 | Demircin | ............ | H03M 7/4006 375/240.02 |
| 2011/0075724 A1 * | 3/2011 | Reznik | ..................... | G06T 9/005 375/240.01 |
| 2013/0272377 A1 * | 10/2013 | Karczewicz | ............ | H03M 7/30 375/240.02 |

* cited by examiner

*Primary Examiner* — Jean B Jeanglaude
(74) *Attorney, Agent, or Firm* — Vorys, Sater, Seymour and Pease LLP; Vincent M DeLuca

(57) ABSTRACT

Data values can be entropy encoded, as part of a data compression process, according to a predetermined variable-length entropy coding scheme (e.g. based on exponential Golomb coding) such that they have $\geq 1$ prefix bits and $\geq 0$ suffix bits. A corresponding entropy decoding process can be performed, whereby the prefix bits are analysed to determine bit-boundaries between the received entropy encoded data values. The suffix bits and the determined bit-boundaries are used to decode the entropy encoded data values. In this way, multiple bit-boundaries can be found during the same clock cycle, e.g. by analysing the prefix bits in parallel decode units, thereby allowing for multiple entropy encoded data values (encoded using a variable-length coding scheme) to be decoded in the same clock cycle.

20 Claims, 18 Drawing Sheets

| Symbol | Binary representation of symbol | Modified Elias Code 'prefix suffix' | | Separated Leading Bit | Interleaved bits (psps...ps) |
|---|---|---|---|---|---|
| 0 | 0000 0000 | 1 | | 1 | - |
| 1 | 0000 0001 | 01 | 1 | 0 | 11 |
| 2 | 0000 0010 | 01 | 0 | 0 | 10 |
| 1-2 | 0000 00AB | 01 | B | 0 | 1B |
| 3 | 0000 0011 | 001 | 11 | 0 | 0111 |
| 4 | 0000 0100 | 001 | 00 | 0 | 0010 |
| 5 | 0000 0101 | 001 | 01 | 0 | 0011 |
| 6 | 0000 0110 | 001 | 10 | 0 | 0110 |
| 3-6 | 0000 0CDE | 001 | DE | 0 | 0D1E |
| 7 | 0000 0111 | 0001 | 111 | 0 | 010111 |
| 8 | 0000 1000 | 0001 | 000 | 0 | 000010 |
| ... | ... | ... | ... | ... | ... |
| 14 | 0000 1110 | 0001 | 110 | 0 | 010110 |
| 7-14 | 0000 FGHI | 0001 | GHI | 0 | 0G0H1I |
| 15 | 0000 1111 | 00001 | 1111 | 0 | 01010111 |
| 16 | 0001 0000 | 00001 | 0000 | 0 | 00000010 |
| ... | ... | ... | ... | ... | ... |
| 254 | 1111 1110 | 00000001 | 1111110 | 0 | 010101010110 |

FIGURE 10

DATA COMPRESSION USING ENTROPY ENCODING

BACKGROUND

Data compression, both lossless and lossy, is desirable in many applications in which data is to be stored in, and/or read from, a memory. By compressing data before storage of the data in a memory, the amount of data transferred to the memory may be reduced. An example of data for which data compression is particularly useful is image data, such as depth data to be stored in a depth buffer, pixel data to be stored in a frame buffer and texture data to be stored in a texture buffer. These buffers may be any suitable type of memory, such as cache memory, separate memory subsystems, memory areas in a shared memory system or some combination thereof.

A Graphics Processing Unit (GPU) may be used to process image data in order to determine pixel values of an image to be stored in a frame buffer for output to a display. GPUs usually have highly parallelised structures for processing large blocks of data in parallel. There is significant commercial pressure to make GPUs (especially those intended to be implemented on mobile devices) operate at lower power levels. Competing against this is the desire to use higher quality rendering algorithms on faster GPUs, which thereby puts pressure on a relatively limited resource: memory bandwidth. However, increasing the bandwidth of the memory subsystem might not be an attractive solution because moving data to and from, and even within, the GPU consumes a significant portion of the power budget of the GPU. The same issues may be relevant for central processing units (CPUs) as well as GPUs.

As described above, one way to reduce the amount of data transferred to the memory is to compress the data that is to be transferred to and from the memory. The time taken for data to be compressed and decompressed adds to the latency of the memory read and write operations and therefore may affect the speed at which the GPU operates. Furthermore, the rate at which data is compressed may be permitted to differ from the rate at which that compressed data is decompressed. As an example, the compression process for compressing texture data (which is typically a lossy compression process) may often be permitted to be significantly slower than the decompression process for decompressing the compressed texture data. In contrast the compression processes for compressing depth data for storage in a depth buffer or pixel data for storage in a frame buffer (which are typically lossless compression processes) ideally should be performed at approximately the same rate as the corresponding decompression processes. GB2451911 discloses a graphics rendering system which can compress a two-dimensional data set.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Data values can be entropy encoded, e.g. as part of a data compression process, according to a predetermined variable-length entropy coding scheme (e.g. based on exponential Golomb coding) such that they have ≥1 prefix bits and ≥0 suffix bits. In some examples, at least some of the prefix bits are interleaved with the suffix bits, and in other examples the prefix bits may be grouped separately to the suffix bits. A corresponding entropy decoding process can be performed, whereby the first and second bits are retrieved (e.g. de-interleaved), and the prefix bits are analysed to determine bit-boundaries between the received entropy encoded data values. The retrieved (e.g. de-interleaved) suffix bits and the determined bit-boundaries are used to decode the entropy encoded data values. In this way, a reduced set of bits can be considered when determining the bit-boundaries which, in turn, means multiple bit-boundaries can be found during the same clock cycle, e.g. by analysing the prefix bits in parallel decode units, thereby allowing for multiple entropy encoded data values (which have been encoded using the variable-length coding scheme) to be decoded in the same clock cycle. As an example, the entropy encoded data values may form a block (e.g. an 8×8 block) and all of the entropy encoded data values from a row of the block (e.g. 8 entropy encoded data values) may be decoded in one clock cycle.

In particular, there is provided a method of performing entropy decoding on a sequence of entropy encoded data values, wherein the entropy encoded data values have been encoded according to a predetermined variable-length entropy coding scheme such that each of the entropy encoded data values comprises one or more first bits and zero or more second bits, wherein for each of the encoded data values the number of first bits is related to the number of second bits according to a predetermined relationship of the entropy coding scheme, and wherein each of a plurality of bit locations in the sequence of entropy encoded data values is predetermined by the entropy coding scheme to include either a first bit or a second bit, the method comprising: receiving the sequence of entropy encoded data values; separating the first bits of the received entropy encoded data values from the second bits of the received entropy encoded data values based on the bit locations of the bits in the sequence of entropy encoded data values in accordance with the entropy coding scheme; analysing the separated first bits of the received entropy encoded data values to determine bit-boundaries between the received entropy encoded data values in accordance with the predetermined relationship between the number of first bits and the number of second bits for each of the received encoded data values; and using the second bits and the determined bit-boundaries to decode the entropy encoded data values in accordance with the predetermined variable-length entropy coding scheme. A computer readable storage medium may be provided having encoded thereon computer readable program code for generating an entropy decoding module configured to perform a method of performing entropy decoding according to any of the examples described herein.

There is provided an entropy decoding module configured to perform entropy decoding on a sequence of entropy encoded data values, wherein the entropy encoded data values have been encoded according to a predetermined variable-length entropy coding scheme such that each of the entropy encoded data values comprises one or more first bits and zero or more second bits, wherein for each of the encoded data values the number of first bits is related to the number of second bits according to a predetermined relationship of the entropy coding scheme, and wherein each of a plurality of bit locations in the sequence of entropy encoded data values is predetermined by the entropy coding scheme to include either a first bit or a second bit, the entropy decoding module being configured to: receive the sequence of entropy encoded data values; separate the first bits of the received entropy encoded data values from the second bits of the received entropy encoded data values based on the bit locations of the bits in the sequence of entropy encoded data values in accordance with the entropy coding scheme; analyse the separated first bits of the received entropy encoded data values to determine bit-boundaries between the received entropy encoded data values in accordance with the predetermined relationship between the number of first bits and the number of second bits for each of the received encoded data values; and use the second bits and the determined bit-boundaries to decode the entropy encoded data values in accordance with the predetermined variable-length entropy coding scheme. A data decompression unit may be provided comprising such an entropy decoding module.

There is provided a method of performing entropy encoding on a plurality of data values to form a sequence of entropy encoded data values according to a predetermined variable-length entropy coding scheme, the method comprising: receiving the data values; for each of the received data values, determining an entropy encoded data value according to the entropy coding scheme, whereby the entropy encoded data values comprise one or more first bits and zero or more second bits, wherein for each of the encoded data values the number of first bits is related to the number of second bits according to a predetermined relationship of the entropy coding scheme; and forming the sequence of entropy encoded data values from the determined entropy encoded data values, wherein each of a plurality of bit locations in the sequence of entropy encoded data values is predetermined by the entropy coding scheme to include either a first bit or a second bit. A computer readable storage medium may be provided having encoded thereon computer readable program code for generating an entropy encoding module configured to perform a method of performing entropy encoding according to any of the examples described herein.

There is provided an entropy encoding module configured to perform entropy encoding on a plurality of data values to form a sequence of entropy encoded data values according to a predetermined variable-length entropy coding scheme, the entropy encoding module being configured to: receive the data values; determine, for each of the received data values, an entropy encoded data value according to the entropy coding scheme, whereby the entropy encoded data values comprise one or more first bits and zero or more second bits, wherein for each of the encoded data values the number of first bits is related to the number of second bits according to a predetermined relationship of the entropy coding scheme; and form the sequence of entropy encoded data values from the determined entropy encoded data values, wherein each of a plurality of bit locations in the sequence of entropy encoded data values is predetermined by the entropy coding scheme to include either a first bit or a second bit. A data compression unit may be provided comprising such an entropy encoding module.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which:

FIG. 10 is a table illustrating how an entropy coding scheme encodes different symbol values.

Figure 1:
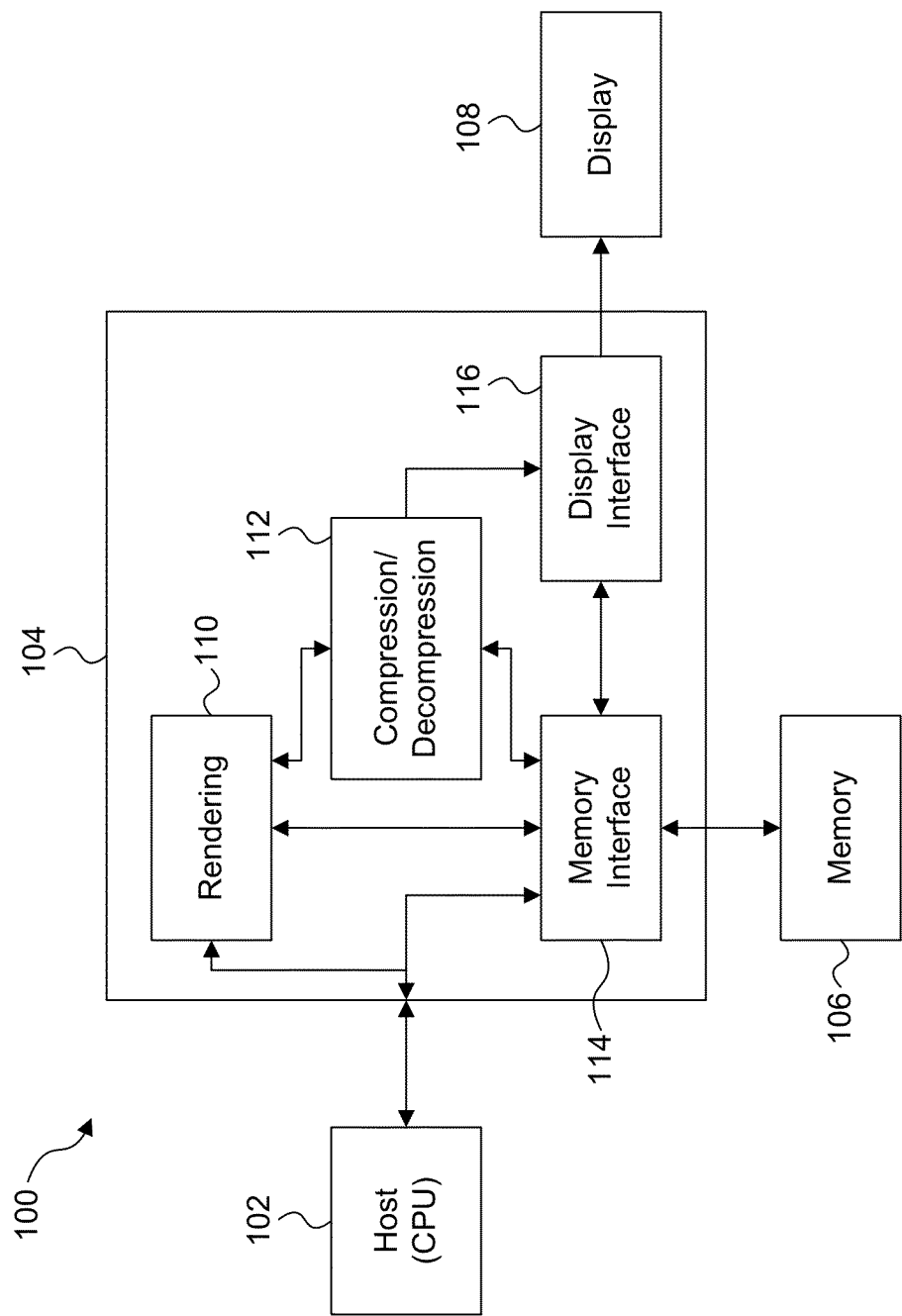
FIG. 1 shows a graphics rendering system.

Common reference numerals are used throughout the figures, where appropriate, to indicate similar features.

DETAILED DESCRIPTION

Embodiments will now be described by way of example only.

Data compression is useful in a variety of different scenarios. Most of the examples described herein relate to the compression (and decompression) of image data for use by a GPU, but similar principles could be applied to the compression (and decompression) of other types of data such as audio, numeric or text data and/or for use by a processing unit other than a GPU, such as a CPU.

FIG. 1 shows a graphics rendering system 100 which may be implemented in an electronic device, such as a mobile device. The graphics rendering system 100 comprises a host CPU 102, a GPU 104, a memory 106 (e.g. a graphics memory) and a display 108. The CPU 102 is arranged to communicate with the GPU 104. Data, which may be compressed data, can be transferred, in either direction, between the GPU 104 and the memory 106. Images which are rendered by the GPU 104 may be displayed on the display 108.

The GPU 104 comprises a rendering unit 110, a compression/decompression unit 112, a memory interface 114 and a display interface 116. The system 100 is arranged such that data can pass, in either direction, between: (i) the CPU 102 and the rendering unit 110; (ii) the CPU 102 and the memory interface 114; (iii) the rendering unit 110 and the memory interface 114; (iv) the memory interface 114 and the memory 106; (v) the rendering unit 110 and the compression/decompression unit 112; (vi) the compression/decompression unit 112 and the memory interface 114; and (vii) the memory interface 114 and the display interface. The system 100 is further arranged such that data can pass from the compression/decompression unit 112 to the display interface 116, and such that data can pass from the display interface to the display 108.

In operation, the GPU 104 processes regions of image data individually. The regions may for example represent rectangular (including square) portions of the image. The rendering unit 110 may perform scan conversion of graphics primitives, such as triangles and lines, using known techniques such as Z-tests and texture mapping. The rendering unit 110 may contain cache units to reduce memory traffic. Some data is read or written by the rendering unit 110, to the memory 106 via the memory interface unit 114 (which may include a cache) but for other data, such as data to be stored in a frame buffer, the data preferably goes from the rendering unit 110 to the memory interface 114 via the compression/decompression unit 112. The compression/decompression unit 112 reduces the amount of data that is to be transferred across the external memory bus to the memory 106 by compressing the data, as described in more detail below.

The display interface 116 sends completed image data to the display 108. An uncompressed image may be accessed directly from the memory interface unit 114. Compressed data may be accessed via the compression/decompression unit 112 and sent as uncompressed data to the display 108. In alternative examples the compressed data could be sent directly to the display 108 and the display 108 could include logic for decompressing the compressed data in an equivalent manner to the decompression of the compression/decompression unit 112. Although shown as a single entity, the compression/decompression unit 112 may contain multiple parallel compression and/or decompression units for enhanced performance reasons.

As a general overview, a compression system may follow a basic algorithmic outline, such that the following steps are performed (not necessarily in the order given below):

1. Division into Blocks

The image data is logically divided into independent, non-overlapping, rectangular blocks in order to permit random access to the compressed data. The size of the blocks is implementation dependent and the blocks may, for example, be 8×8, 16×4, 32×2, 4×4 or 32×16 blocks of data values. Increasing the block size tends to improve the compression ratio that is achieved. However, increasing block size also tends to incur greater hardware costs and, furthermore, may have decreased efficiency when access patterns become less coherent. So there is a balance to be struck when selecting the block size, which is implementation dependent and which may, for example, depend upon characteristics of the type of data that is to be compressed. The block size may be selected independently of the size of the regions processed by the GPU, however there may be some benefit from selecting a block size such that it is a convenient multiple of the region size, or vice versa.

2. Format Conversion

Some buffers, e.g. the depth buffer, may store data in floating-point format, but performing lossless arithmetic on floating-point numbers can be problematic. Therefore, the floating-point values may be interpreted as signed magnitude integer values to permit lossless calculations. Format conversion may also be used where the data values comprise a plurality of channels representing data of different colour components, wherein the values in the channels are not multiples of 8 bits, e.g. RGB5:6:5 or ARGB2:10:10:10 formats. The format of the data values may be converted so that each channel has values which are multiples of 8 bits (e.g. ARGB 8:8:8:8 format). The format conversion step is not always needed in the compression process, e.g. when the data is already in an integer format, or some other format on which lossless arithmetic can be performed.

3. Colour Channel Decorrelation

The data values may comprise a plurality of channels representing data of different colour components. For example, the data may be in ARGB 8:8:8:8 format, where there are 8-bits to represent each of the Alpha, Red, Green and Blue channels of each of the data values. There is frequently considerable correlation between the values of some or all of the colour channels (e.g. the R, G and B channels), and a compression algorithm can take advantage of this correlation to compress the data by, on average, reducing the range of some of the channels. Suitable colour space transforms for exploiting the correlation between the different colour channels are known in the art, for example as described in GB2451911, and are not described in detail herein. Suitable colour space transforms are lossless and "non-expanding" meaning that the number of bits used to represent a colour value does not increase due to the colour space transform.

4. Spatial Decorrelation

Spatial decorrelation (also referred to as 'prediction') removes some of the correlation between nearby pixels, thereby reducing, on average, the dynamic ranges of the values. A method for performing spatial decorrelation is described below in detail with reference to FIGS. 6 to 9.

5. Entropy Encoding

Entropy encoding makes use of the statistical properties of the decorrelated data to reduce the number of bits used to represent the data. Arithmetic coding schemes are relatively computationally intensive and slow. Therefore, relatively simple Variable Length Coding (VLC) (e.g. Huffman or Golomb-Rice) or Run-Length based entropy encoding schemes have been used. However, it can be difficult to perform entropy encoding at high speeds even with the simple VLC encoding schemes. A new method for performing entropy encoding and decoding at high speed and with low computational complexity is described below in detail with reference to FIGS. 10 to 14.

6. Storage

Finally, the compressed data is stored in the memory 106. The details of the mechanism for storing data in the memory 106 will be known to those skilled in the art, and as such are not described in great detail herein.

A decompression system may follow the reverse of the basic algorithmic outline given above for compression (not necessarily in the reverse of the order given above).

Figure 2:
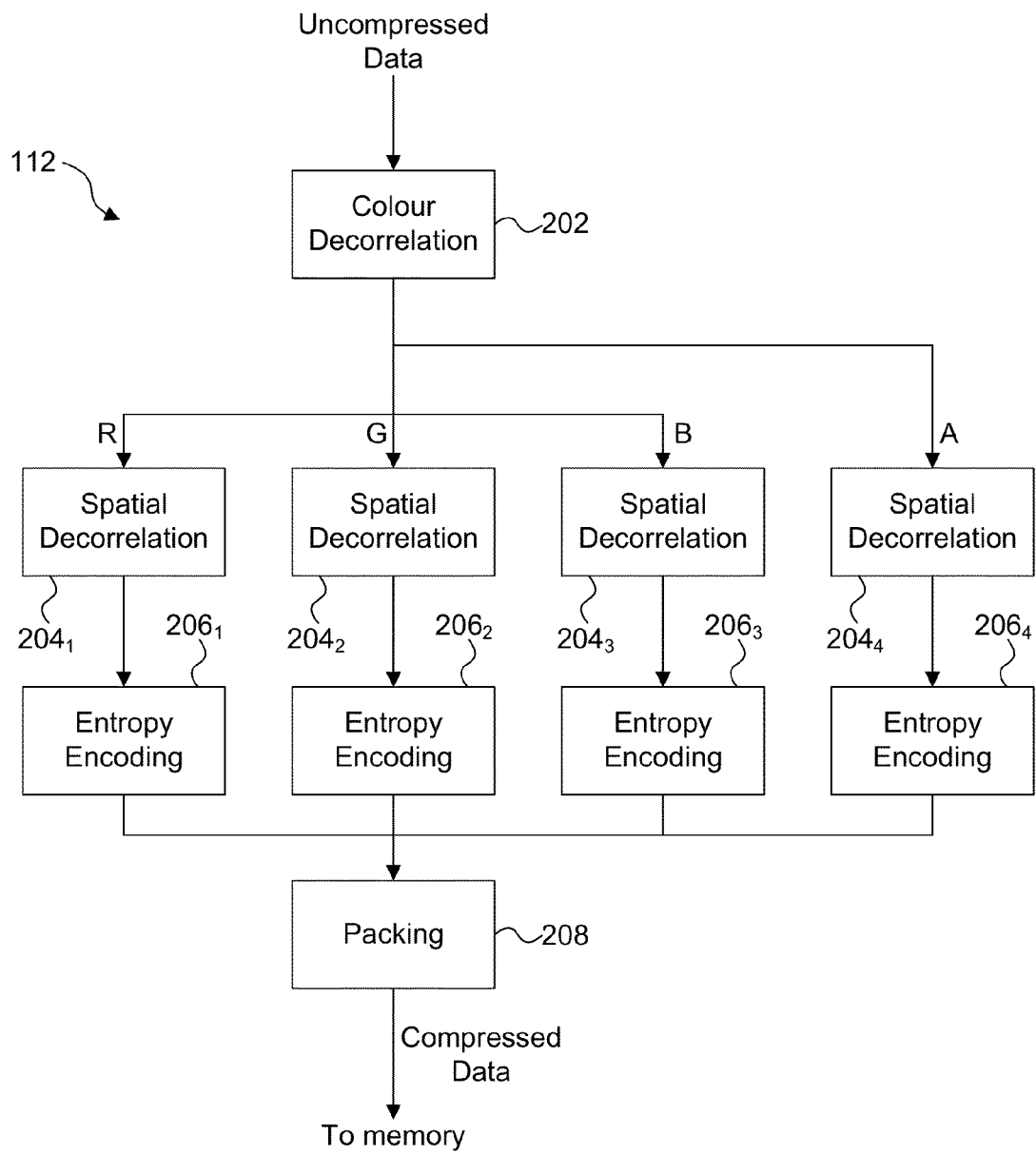
FIG. 2 shows a data compression unit.

The general compression algorithm given above may be applied in the compression/decompression unit 112. FIG. 2 shows modules of the compression/decompression unit 112 which are to be used to compress a block of ARGB data values which comprise four 8-bit channels, when the compression/decompression unit 112 is operating as a compression unit. In other examples the compression/decompression unit 112 may be used to compress blocks of data values which have other formats. The compression unit 112 comprises a colour decorrelation module 202, four spatial decorrelation modules $204_1$ to $204_4$, four entropy encoding modules $206_1$ to $206_4$ and a packing module 208.

Figure 3:
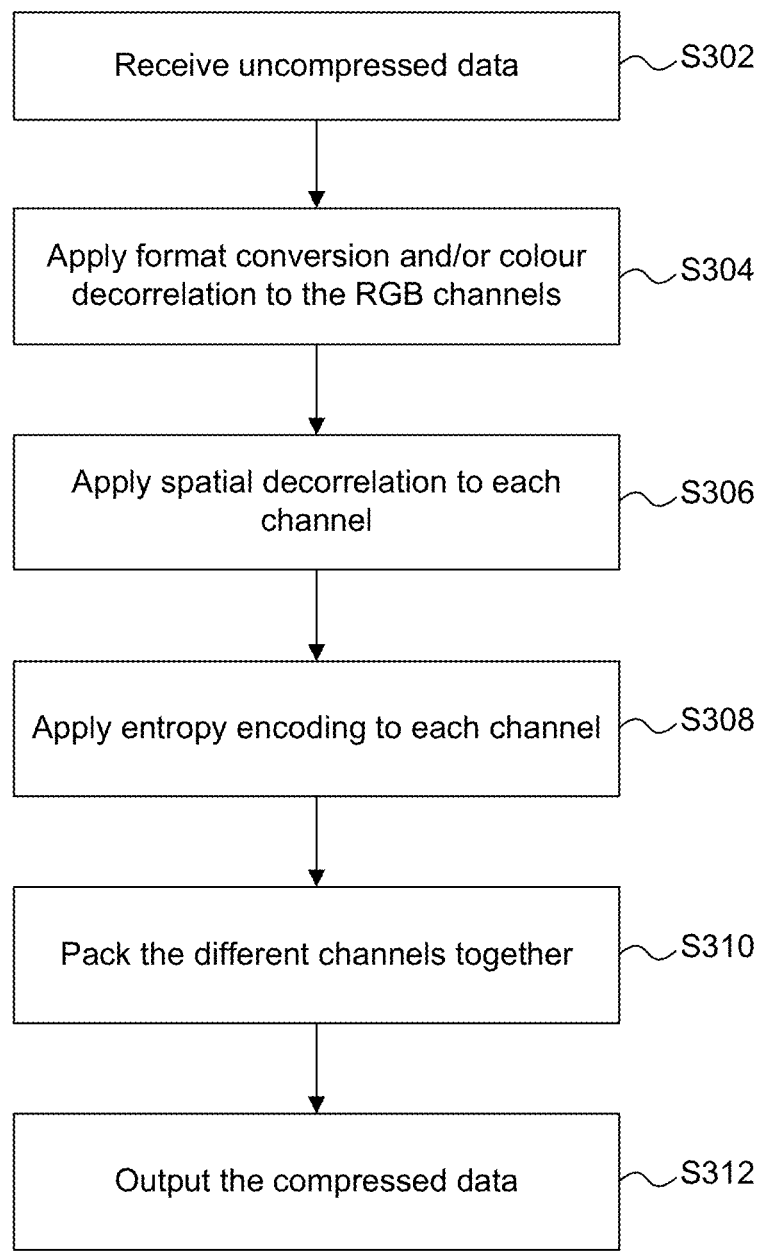
FIG. 3 shows a flow chart for a method of compressing data.

FIG. 3 shows a flow chart for a method of compressing a block of data. In step S302 a block of uncompressed data is received at the compression unit 112. The first step of the general compression algorithm given above, i.e. the division into blocks, may be performed on the data before it is received at the compression unit 112. Alternatively, this step may be performed at the compression unit 112. The uncompressed data is received at the colour decorrelation module 202. In step S304 the colour decorrelation module 202 may apply the format conversion to the data values as described above. It is noted that the format conversion step might not be implemented, e.g. when the data is already in a suitable format (such as in an integer format), such that no format conversion is necessary. In the example shown in FIGS. 2 and 3, the data received at the compression unit 112 is already divided into blocks, e.g. 8×8 blocks. Furthermore, in this example, the received data is in ARGB 8:8:8:8 format, and no format conversion is needed in step S304. That is, in this example, each data value in the 8×8 block comprises 32 bits: 8 bits for the Alpha channel, 8 bits for the Red channel, 8 bits for the Green channel and 8 bits for the Blue channel.

In step S304 the colour decorrelation module 202 also applies colour decorrelation to the data values. Suitable colour decorrelation methods are known in the art. Preferably, a colour decorrelation method is used which does not expand any of the output channels, i.e. the number of bits output from the colour correlation module 202 is not greater than the number of bits input to the colour decorrelation module 202.

In other examples, the data values of the Alpha channel are sent to the spatial decorrelation module $204_4$, and the data values of the R, G and B channels are sent to the colour decorrelation module 202, such that the colour decorrelation module 202 applies the colour decorrelation only to the R, G and B values.

It has been found (e.g. as shown in GB2451911) that the following, remarkably simple, colour transform performs well for 8-bit colour values:

$$R' = R - G \bmod 2^8$$

$$G' = G$$

$$B' = B - G \bmod 2^8$$

$$A' = A$$

where R, G, B and A are the data values of the channels received at the colour decorrelation module 202 and R', G', B' and A' are the data values of the decorrelated colour channels output from the colour decorrelation module 202.

The distribution of the transformed channels, R' and B', is not dissimilar to a (bounded) Laplace distribution function centred on zero. Performing the modulo operation in the transforms shown above reduces the dynamic range of the distribution such that fewer bits can be used than if the values of R-G and B-G were used without performing the modulo operations. It is noted that the modulo operation given above is mod $2^8$ because each data value in the channels comprises 8 bits in the example given above. In other examples, each data value may have a different number of bits, e.g. n bits, in which case the modulo operation would be changed accordingly, e.g. to be mod $2^n$.

The colour-decorrelated values of the Red, Green, Blue and Alpha channels are output from the colour decorrelation module 202 and split from each other in order to be passed to the respective spatial decorrelation modules $204_1$, $204_2$, $204_3$ and $204_4$. In step S306 the spatial decorrelation modules 204 each apply spatial decorrelation to a block of data values of the respective colour channels to thereby remove a significant portion of the correlation between pixels in the block. The selection of a spatial decorrelation method should consider a trade-off between relevant factors, such as the reduction in spatial correlation that can be achieved, the complexity and/or the latency of the operations involved in the spatial decorrelation and the complexity and/or the latency of the operations involved in recorrelating the spatially decorrelated values. An example of the spatial decorrelation applied by each of the spatial decorrelation modules 204 is described in more detail below with reference to FIGS. 6 to 9.

The spatially decorrelated data values are output from each of the spatial decorrelation modules $204_1$ to $204_4$ and are provided to the corresponding entropy encoding modules $206_1$ to $206_4$. In step S308 the entropy encoding modules 206 apply entropy encoding to the data values. The entropy encoding is performed according to a variable-length coding (VLC) scheme, such that the entropy encoded values will most likely not all have the same number of bits. In general, more probable values are encoded with fewer bits. In this way, it is likely that the total number of bits used to encode all of the data values in a data block will be reduced by the entropy encoding. This is generally true, even if the entropy encoding does result in a few data values being represented using a greater number of bits following the entropy encoding, e.g. more than eight bits in the examples where the spatially decorrelated data values are represented using eight bits. There are some situations where spatial decorrelation can expand data, and these situations can be treated as special cases (i.e. the data is treated differently to other cases) in order to limit the expansion.

VLC encoding can be reasonably straightforward to perform at a high rate, but VLC decoding at a matching rate can be significantly more difficult because the bit-boundaries between contiguously stored encoded data values are not known until the encoded data is analysed, i.e. the length of the encoded data values is not known until the encoded data is analysed. In particular, when encoding, multiple symbols can be mapped independently to their corresponding codes and code lengths, and then merged into a contiguous output bit stream. However, typically when decoding, each code in the encoded bit stream must be examined sequentially in order to determine its length which, in turn, determines the location of the start of the next code. In other words, the bit-boundaries between the different encoded data values need to be found. While it is possible to embed pointers (i.e. offsets) at the head of the stream to assist in decoding several symbols in parallel (e.g. to identify the bit-boundaries in the stream), doing so compromises the compression rate since additional bits are used for the pointers/offsets. An example of the entropy encoding applied by each of the entropy encoding modules 206 is described in more detail below with reference to FIGS. 10 to 12.

The entropy encoded data values are output from each of the entropy encoding modules 206 and are provided to the packing module 208. In step S310 the packing module packs the encoded data values from the different channels together into a compressed data block in accordance with a packing scheme. In step S312 the packed data values are output from the packing module 208 as compressed data. The compressed data may be sent to the memory 106 (e.g. via the memory interface 114) for storage therein.

The steps shown in FIG. 3 are iterated for different data values. A plurality of data values (e.g. a row of data values from a block of uncompressed data values) may be processed on each iteration. The iterations may be performed on respective consecutive clock cycles. Therefore, as an example, where there are eight data values in a row of the block, eight data values may be compressed per clock cycle.

Figure 4:
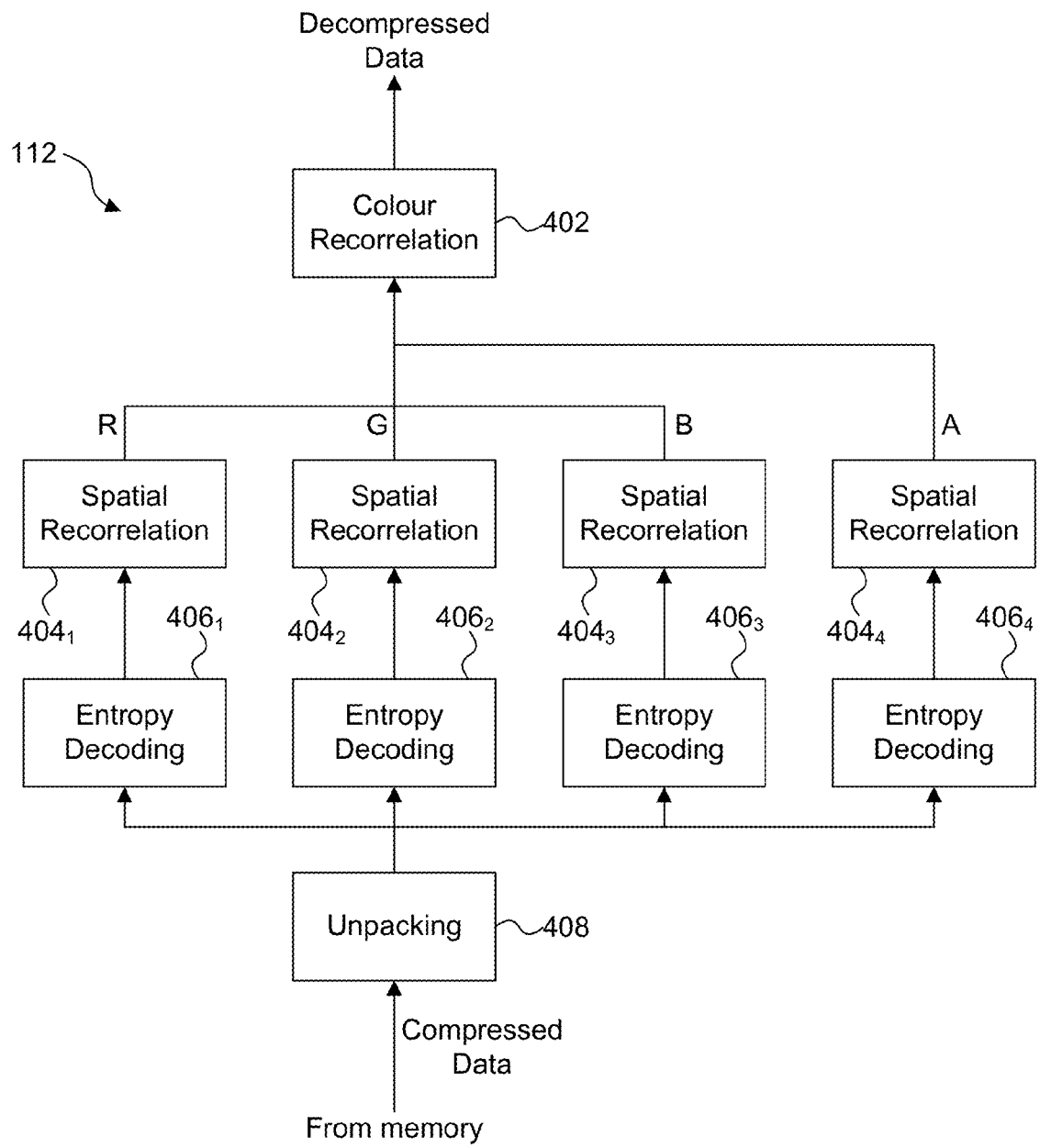
FIG. 4 shows a data decompression unit.

FIG. 4 shows modules of the compression/decompression unit 112 which are to be used to decompress a block of ARGB data values, when the compression/decompression unit 112 is operating as a decompression unit. The decompression unit 112 comprises a colour recorrelation module 402, four spatial recorrelation modules $404_1$ to $404_4$, four entropy decoding modules $406_1$ to $406_4$ and an unpacking module 408.

Figure 5:
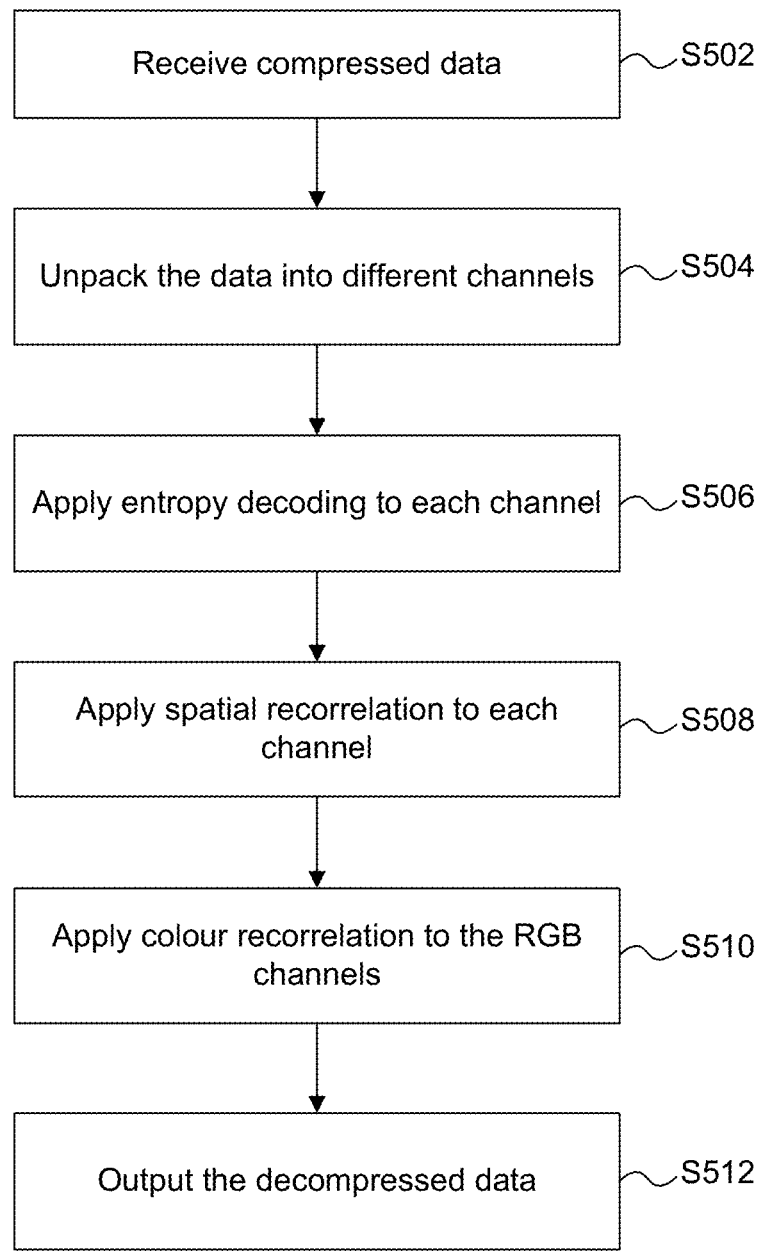
FIG. 5 shows a flow chart for a method of decompressing data.

FIG. 5 shows a flow chart for a method of decompressing a block of data. In step S502 compressed data is received at the unpacking module 408 of the decompression unit 112 from the memory 108 (e.g. via the memory interface 114). The compressed data has been compressed using the method described above in relation to FIGS. 2 and 3. In step S504 the compressed data values are unpacked into different channels for the different colour components (e.g. Red, Green, Blue and Alpha channels). The compressed data is unpacked in accordance with an unpacking scheme which corresponds to the packing scheme used to pack the data values into a compressed data block in step S310. The encoded data values (i.e. the compressed data) for the different channels are provided to respective ones of the entropy decoding modules 406.

In step S506 each of the entropy decoding modules 406 apply entropy decoding to the encoded data values. The entropy decoding is performed in accordance with the variable-length coding (VLC) scheme that was used in step S308 to encode the data values. An example of the entropy decoding applied by each of the entropy decoding modules 406 is described in more detail below with reference to FIGS. 13 and 14.

The entropy decoded data values are output from the entropy decoding modules $406_1$ to $406_4$ and are provided to the corresponding spatial recorrelation modules $404_1$ to $404_4$. In step S508 the spatial recorrelation modules 404 each apply spatial recorrelation to the entropy decoded data values of the respective colour channels. In this way the spatial decorrelation that was applied to the data values in step S306 is reversed.

The data values of the R, G, B and A channels are sent to the colour recorrelation module 402. In step S510 the colour recorrelation module 402 applies colour recorrelation to the data values of the R, G, B and A channels. The colour recorrelation method is chosen to be the reverse of the colour decorrelation method used in step S304 described above. In some other examples, the alpha channel might bypass the colour recorrelation module 402, e.g. if it is not needed for the colour recorrelation.

Following step S510 the data values for each of the channels (e.g. R, G, B and A channels) have been decompressed, and in step S512 these data values are output as the decompressed data. The decompressed data may be output to any other element in the device. The decompressed data may be used in any suitable manner, for example, if the data is image data, the decompressed data may be output to the display interface 116 for output to the display 108. In other examples, the data may be used as a source for a video compositor or as a texture in a 3D render.

The steps shown in FIG. 5 are iterated for different data values. A plurality of data values (e.g. a row of data values from a block of decompressed data values) may be processed on each iteration. The iterations may be performed on respective consecutive clock cycles. Therefore, as an example, where there are eight data values in a row of the block, eight data values may be decompressed per clock cycle. When there are multiple channels of data, those channels may be decompressed independently. For example, an ARGB system might decompress 32 (i.e. 4×8) data values per clock cycle.

It can be useful to allow a predictable number of data values to be compressed and/or decompressed in each clock cycle. This is not necessarily trivial when variable-length entropy coding is used and/or when 2D spatial decorrelation is to be performed. Furthermore, the ability to compress and decompress multiple data values (e.g. eight data values) on each clock cycle allows the compression and decompression of blocks of data to be performed quickly, i.e. with reduced latency, compared to other compression or decompression methods which cannot compress and/or decompress as many data values in each clock cycle.

Examples showing how the spatial decorrelation and the entropy encoding/decoding modules can achieve the compression/decompression rates mentioned above are described below.

Figure 6:
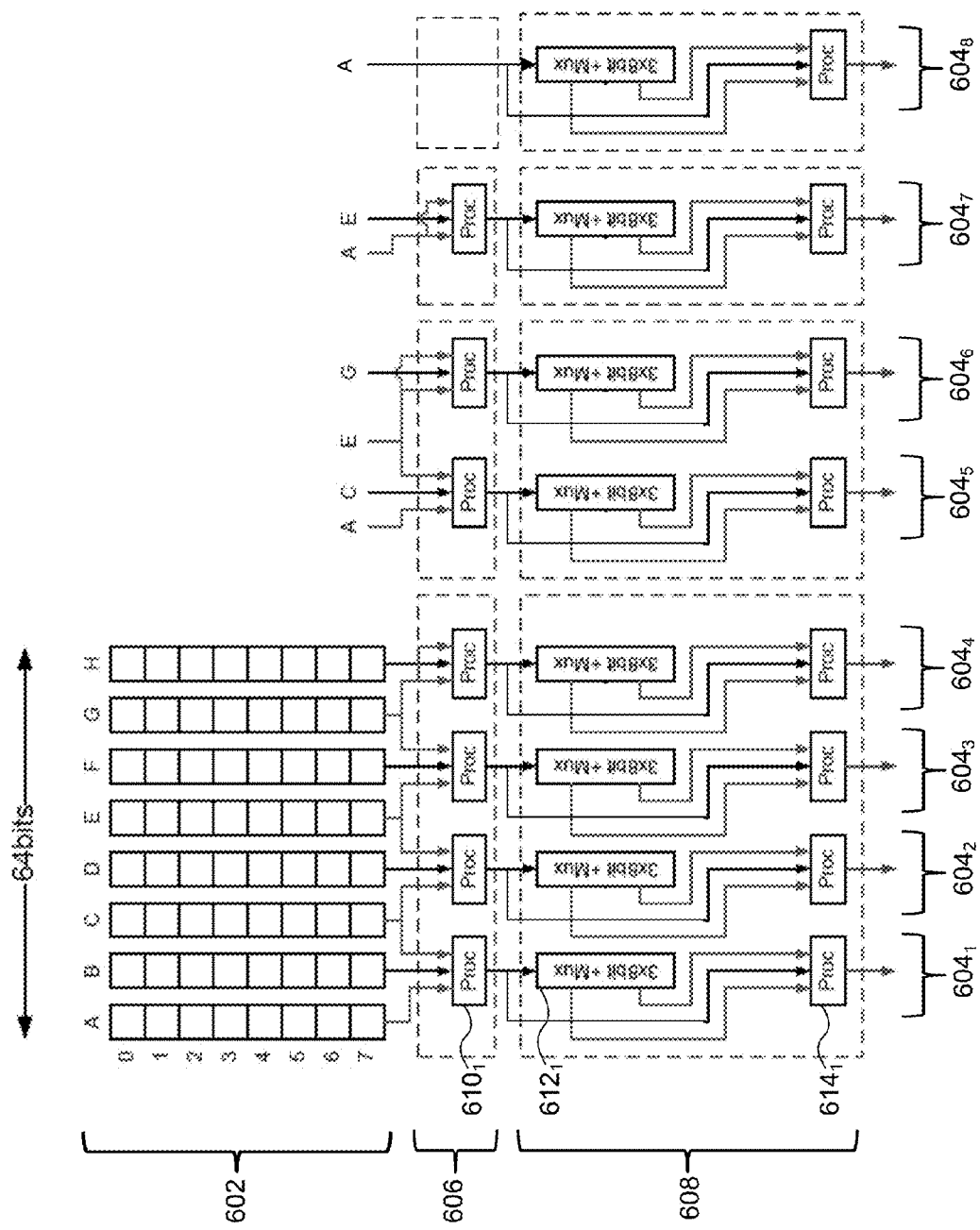
FIG. 6 shows a spatial decorrelation module.
Figure 9:
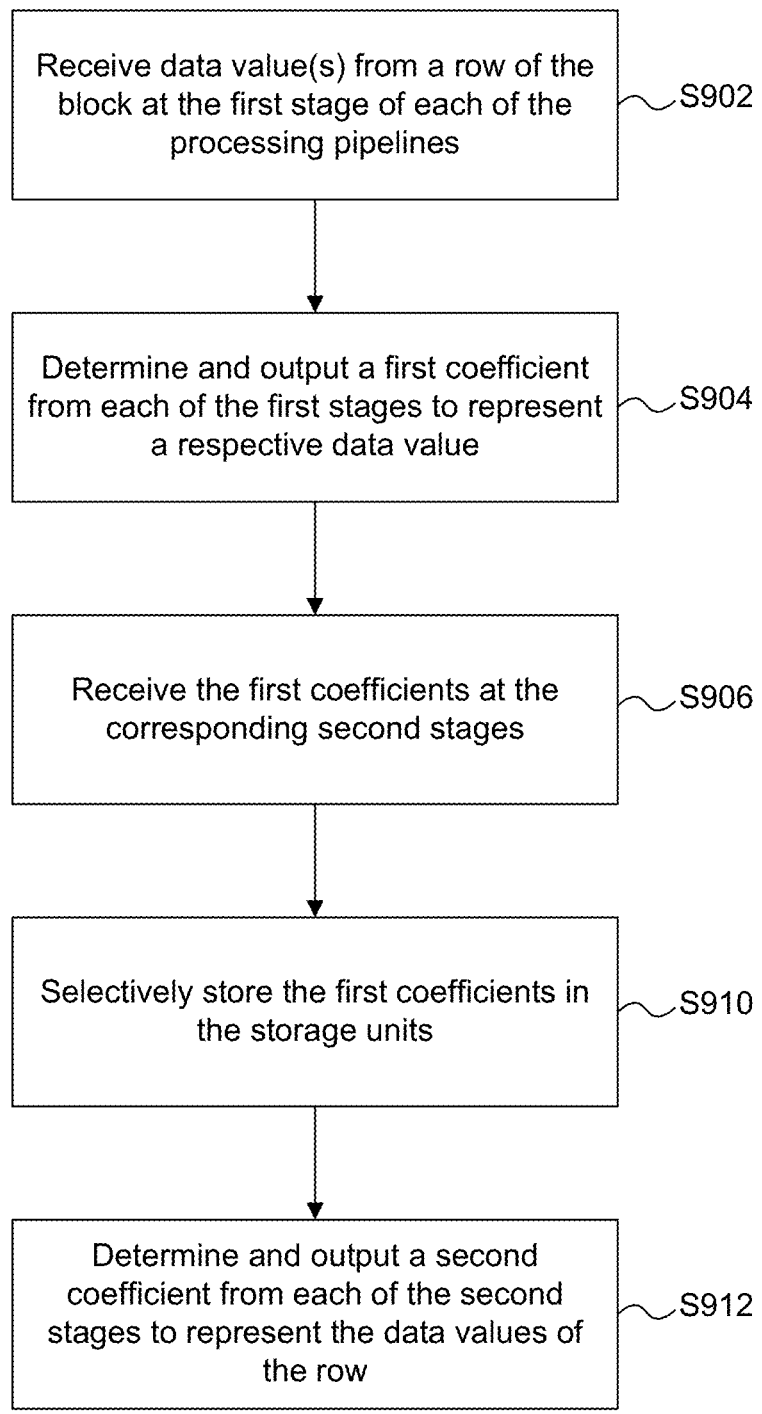
FIG. 9 shows a flow chart for a method of performing spatial decorrelation on a block of data values.

FIG. 6 shows one of the spatial decorrelation modules 204 which may be implemented in any one of the colour channels. In the example shown in FIG. 6, an 8×8 block of data values 602 for the channel is received at the spatial decorrelation module 204. The data values in the data block 602 are arranged into a two dimensional array of eight rows (labelled 0 to 7 in FIG. 6) and eight columns (labelled A to H in FIG. 6). Each of the data values comprises 8 bits in the example shown in FIG. 6 such that each row of the data block comprises 64 bits. The spatial decorrelation module 204 is configured to process the rows of the data block on respective consecutive clock cycles to thereby perform spatial decorrelation in two dimensions on the data values from the block. FIG. 9 shows a flow chart for a process of performing two dimensional (2D) spatial decorrelation on the block of data values 602 at the spatial decorrelation module 204.

The spatial decorrelation module 204 comprises a plurality of parallel processing pipelines ($604_1$ to $604_8$) each comprising a first stage 606 and a second stage 608.

The first stages 606 of the processing pipelines 604 are configured to implement spatial decorrelation along rows of data values. The first stages 606 of all of the processing pipelines 604 except for the last processing pipeline $604_8$ comprise a processing unit 610 which is configured to determine a first coefficient to represent a respective one of the data values from a row that is being processed. The second stages 608 of the processing pipelines 604 are configured to implement spatial decorrelation along columns of data values. The second stage 608 of each of the processing pipelines 604 comprises a storage unit (e.g. a register 612) and a processing unit 614. In the example shown in FIG. 6, the registers 612 have sufficient capacity to store at least three of the data values, which for example each have eight bits. It is noted that in FIG. 6 the processing unit $610_1$, the register $612_1$ and the processing unit $614_1$ are labelled for the first processing pipeline $604_1$, but for clarity the corresponding processing units $610_n$, registers $612_n$ and processing units $614_n$ are not labelled in FIG. 6 for the other processing pipelines $604_n$ (where $2 \leq n \leq 8$).

In operation, in step S902 the data values from a row (e.g. row 0) of the data block 602 are received. In particular, each of the processing pipelines 604 is configured to receive one or more of the data values from a particular row of the data block. In the example shown in FIG. 6 the processing units 610 of the first stages of the processing pipelines $604_1$ to $604_7$ receive more than one of the data values from a particular row of the data block 602, but the first stage of the processing pipeline $604_8$ receives just one of the data values from a particular row of the data block 602. In step S904, each of the first stages 606 determine a first coefficient which represents a respective one of the data values of the particular row. The first coefficients are determined by the processing units 610 of the processing pipelines $604_1$ to $604_7$ based on the data values received at the processing units 610 in step S902, and according to any suitable prediction scheme, such as a scheme based on Linear prediction or based on Haar prediction. The first stage 606 of the last processing pipeline $604_8$ simply determines the first coefficient to be the same as the data value received thereat.

In each of the first stages of the processing pipelines $604_1$ to $604_7$, in order to determine a first coefficient to represent a data value, a prediction of the data value is determined using other data values, and then the first coefficient is based on the difference between the received data value and the prediction of the data value. Provided the prediction is sufficiently accurate, the value of the first coefficient (e.g. the difference between the actual data value and the prediction value) is generally significantly less than actual data value itself, and can therefore be represented using fewer bits. The first coefficients may often be equal to, or nearly equal, to zero.

The Linear or Haar prediction schemes may include a two stage process: prediction and then update, i.e. prediction and error compensation. The Linear and Haar prediction schemes are based on $2^{nd}$ generation wavelets. That is, for every data value at an odd numbered position in a row or column (which may be referred to as an "odd data value") a predicted value is determined based on some set of one or more data values at even positions (which may be referred to as "even data values"). In the Haar prediction scheme the determination is based on one even data value, and in the Linear prediction scheme the determination is based on two even data values. The odd data values are replaced with differences between the actual data values and the predicted values. Then the prediction is repeated on a different scale to predict other data values. The primary aim of the update step is to preserve image moments. Maintaining such statistical properties is useful when coefficients are quantised as part of a lossy compression process but, for lossless data compression as in examples described herein, the update steps are not included. Avoiding the update steps: a) has no significant detrimental effect on the average compression ratio, b) halves the number of hardware operations in the prediction processes, and c) greatly shortens the calculation dependency chain for both encoding and decoding.

The Linear and/or Haar prediction schemes may be applied at different spatial frequencies to thereby predict different ones of the data values. At each frequency a set of the data values is used to replace odd data values with differences between actual and predicted data values. When taking the highest frequency, all of the data values from the data block are in the set of data values that are used. The odd data values in the set, $P_{2i+1}$, (where i is an integer) are predicted from one or more neighbouring data values from the set with even indices e.g. $P_{2i}$ and/or $P_{2i+2}$, and $P_{2i+1}$ is replaced with the difference between the actual and predicted value for $P_{2i+1}$. At a lower frequency, the set includes fewer (e.g. half) of the data values from the data block. The process can be repeated at lower frequencies until all but one of the data values in a row are predicted from one or more other data values in that row. For example, with reference to FIG. 6, data values in column B are predicted from data values in columns A and C; data values in column C are predicted from data values in columns A and E; and data values in column E are predicted from data values in column A. The prediction and replacement operations, which are used to determine the first coefficients, $P'_{2i+1}$, for the odd data values, $P_{2i+1}$, using the Linear and Haar prediction schemes are given by:

$$P'_{2i+1} = P_{2i+1} - L\text{Predict}(P_{2i}, P_{2i+2}) \bmod 2^8 \quad \text{(Linear)}$$

$$P'_{2i+1} = P_{2i+1} - P_{2i} \bmod 2^8 \quad \text{(Haar)}$$

where the function LPredict is given by:

$$L\text{Predict}(A, B) = \begin{cases} \left(\left\lfloor \frac{A+B}{2} \right\rfloor + 2^7\right) \bmod 2^8, & \text{if } |A-B| \geq 2^7 \\ \left\lfloor \frac{A+B}{2} \right\rfloor \bmod 2^8, & \text{otherwise} \end{cases}$$

Figure 7:
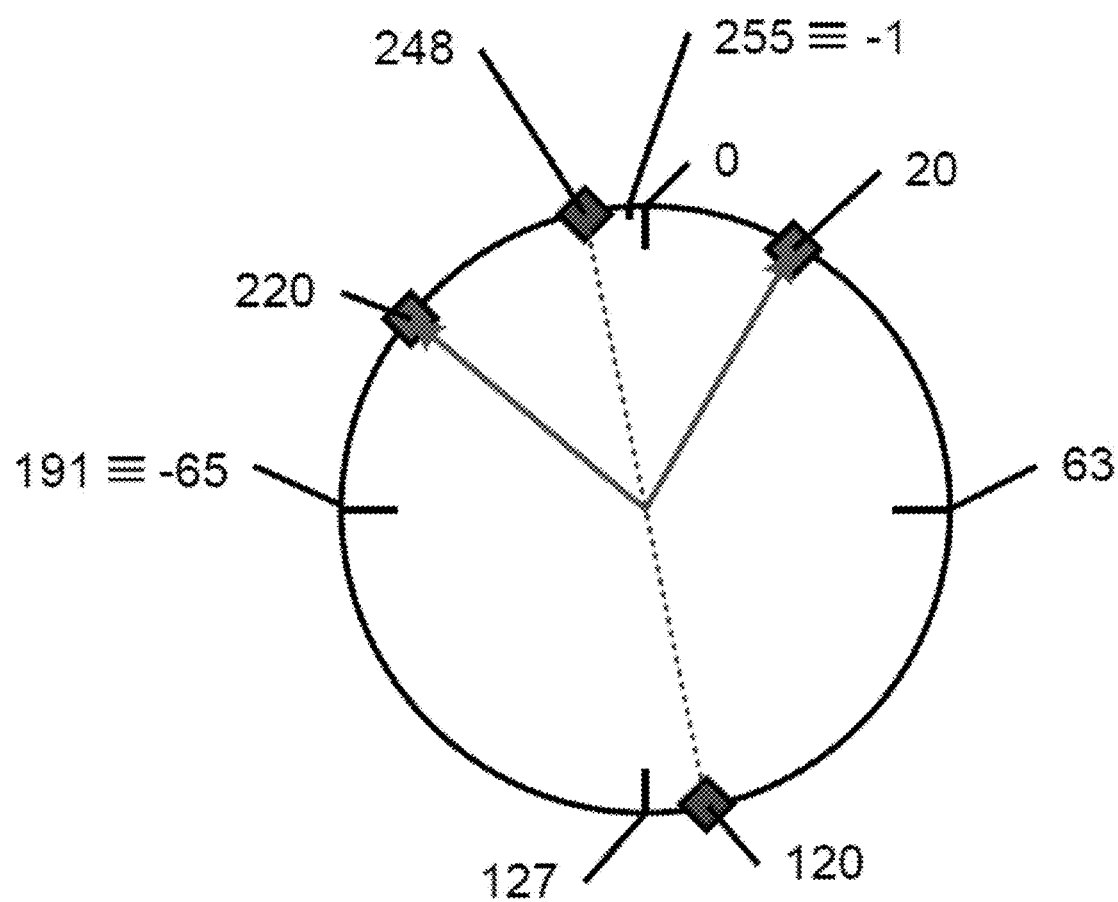
FIG. 7 shows an illustration of a Linear prediction method.

The purpose of the LPredict function is to generate the most probable average of two input values that have been calculated modulo $2^8$. Referring to FIG. 7, if one considers a clock face with 256 (i.e. $2^8$) 'minutes', then there are two paths one can take to traverse from any two positions on the clock. Because, in the example shown in FIG. 7, calculations are performed mod $2^8$, any 8-bit value represents all values of the larger, but finite, congruent set, but given that the expected probability distribution function is heavily biased towards zero, values with smaller magnitudes are far more likely to be the actual value. As an example, FIG. 7 shows an illustration of how the LPredict function can predict a value for the data value $P_{2i+1}$ when $|P_{2i}-P_{2i+2}| \geq 2^7$. In the example shown in FIG. 7, $P_{2i}=220$ and $P_{2i+2}=20$. If a simple average is taken of these two values, by determining $$\left\lfloor \frac{P_{2i}+P_{2i+2}}{2} \right\rfloor$$

mod $2^8$, then the result will be 120. However, according to the equations given above, since $|P_{2i}-P_{2i+2}| \geq 2^7$, then the result of the LPredict function is given by $$\left(\left\lfloor \frac{P_{2i}+P_{2i+2}}{2} \right\rfloor + 2^7\right)$$

mod $2^8 = (120+128) \bmod 2^8 = 248$, as shown in FIG. 7. Due to the modulo operation, 248 is congruent to a value of −8. A value of −8 is much more likely than a value of 120, and as such −8 (which is congruent to 248) is determined as the result of the LPredict function.

The 'branch' in the LPredict function is trivial to implement in hardware, since the 'comparison' is an XOR of the two Most Significant Bits (MSBs) of the two data values $P_{2i}$ and $P_{2i+2}$. Furthermore, the applied offset (of $2^7$) is again, implemented as a one-bit XOR operation.

Spatial decorrelation is applied to the different colour channels independently by the respective spatial decorrelation modules 204. In an example, each of the spatial decorrelation modules 204 operate as shown in FIG. 6 with a throughput of one 8×8 block of data values in 8 clock cycles, stepping to a different row of the block each on each clock cycle. Each of the processing units (610 and 614) shown in FIG. 6 can perform either a linear or, by repetition of the inputs, a Haar prediction per clock cycle. In other examples, the processing units which only perform Haar predictions (e.g. processing units $610_4$, $610_6$ and $610_7$), might only receive two inputs, to avoid repeating inputs. If two adjacent neighbouring data values at a particular frequency are available then the Linear prediction is applied, whereas if only one adjacent neighbouring data value is available at a particular frequency then the Haar prediction is applied. On each clock cycle a row is decorrelated at three frequencies using linear prediction for columns B, D, F, and C, and Haar prediction for columns H, G and E. For 8×8 blocks, column A is unmodified by the horizontal prediction performed by the processing units 610.

The equations given above for the Linear and Haar prediction schemes relate to the case in which the data values comprise 8 bits. It would be immediately apparent to a person skilled in the art how to modify these equations for data values having a different number of bits. For example, for n-bit data values, occurrences of $2^8$ in the equations above would be replaced with $2^n$ and occurrences of $2^7$ would be replaced by $2^{n-1}$.

The first coefficients determined by the first stages 606 of the processing pipelines 604 are output from the first stages to the corresponding second stages 608 of the processing pipelines 604.

In particular, in the example shown in FIG. 6, the first stage 606 of the first processing pipeline $604_1$ receives data values of a particular row from column positions A, B and C and outputs a first coefficient to represent the data value of the particular row from column position B; the first stage 606 of the second processing pipeline $604_2$ receives data values of the particular row from column positions C, D and E and outputs a first coefficient to represent the data value of the particular row from column position D; the first stage 606 of the third processing pipeline $604_3$ receives data values of the particular row from column positions E, F and G and outputs a first coefficient to represent the data value of the particular row from column position F; the first stage 606 of the fourth processing pipeline $604_4$ receives data values of the particular row from column positions G and H and outputs a first coefficient to represent the data value of the particular row from column position H; the first stage 606 of the fifth processing pipeline $604_5$ receives data values of the particular row from column positions A, C and E and outputs a first coefficient to represent the data value of the particular row from column position C; the first stage 606 of the sixth processing pipeline $604_6$ receives data values of the particular row from column positions E and G and outputs a first coefficient to represent the data value of the particular row from column position G; the first stage 606 of the seventh processing pipeline $604_7$ receives data values of the particular row from column positions A and E and outputs a first coefficient to represent the data value of the particular row from column position E; and the first stage 606 of the eighth processing pipeline $604_8$ receives data values of the particular row from column position A and outputs a first coefficient to represent the data value of the particular row from column position A.

It is noted that the last processing pipeline $604_8$ does not need a processing unit in the example shown in FIG. 6 in which an 8×8 block of data values is processed because in this case the data values for column A pass through the first stage 606 of the processing pipeline $604_8$ unchanged.

In step S906 the first coefficients outputted from the first stages 606 are received at the corresponding second stages 608 of the processing pipelines 604. In particular, the first coefficients are received at the registers 612 of the second stages 608 of the processing pipelines 604.

The first coefficients are then spatially decorrelated vertically. The rows of the data block are input to the parallel processing pipelines 604 in an order such that after a first one of the rows has been received by the second stages 608 and stored in the registers 612, the second coefficients of each subsequent row of the block that is received at the second stages 608 can be determined based on the stored data values in the registers 612. For example, as described in more detail below, the rows may be supplied to the processing pipelines 604 in the order: row 0, row 4, row 6, row 7, row 5, row 2, row 3 and then row 1. The transpose of the horizontal decorrelation described above is then applied in the y-direction (i.e. in a vertical direction along the columns), at the target rate, with only minimal additional storage. In particular, as in the example shown in FIGS. 6 and 8 (described below), the registers 612 may not need to store more than three of the data values at any one time.

One slight variation in the processing can be made if the input pixels are known to be adjacent samples in a multi-sample anti-aliasing (MSAA) scheme. For MSAA there is a high probability that neighbouring data values will be identical. In this situation, Haar prediction may be used for an appropriate number of initial frequencies because Haar prediction is based on the difference between two adjacent data values, which in this case is likely to be zero, and may therefore result in lower data values (which can be represented with fewer bits) than if a Linear prediction is used.

In step S910 the first coefficients received from the corresponding first stages 606 are selectively stored in the registers 612 of each of the second stages 608 of the processing pipelines 604. That is, for some of the rows, the first coefficients are stored in the registers 612, whereas for others of the rows, the first coefficients are not stored in the registers 612. In particular, the first coefficients are stored in the registers 612 if those first coefficients are to be used to determine the second coefficients for subsequent rows.

For each of the processing pipelines 604, the register 612 is configured to output up to two values at a time (e.g. per clock cycle) to the respective processing unit 614. On each iteration, the first coefficients received from the first stage 606 of the corresponding processing pipeline 604 are passed to the respective processing unit 614 and the registers 612 are configured to output zero, one or two of the first coefficients stored in the registers 612 to the respective processing unit 614. In step S912, each of the processing units 614 determines a second coefficient to represent a respective one of the data values from the row being processed. The second coefficients are spatially decorrelated values representing the data values of the block and are output from the spatial decorrelation module 204. For the first row of data values of a block, the second coefficients are determined based solely on the first coefficients received for the data values of that row. The first coefficients for the data values of the first row are stored in the registers 612 such that, for a subsequent row of data values from the block, the second coefficients are determined based on the stored first coefficients and the first coefficients for the subsequent row. For example, for all of the rows of data values except the first row of a block, the second coefficients for a row of data values are determined based on: (i) the corresponding first coefficients for the row received at the second stages 608, and (ii) at least one of the first coefficients for a respective at least one other row stored in the respective registers 612.

Figure 8:
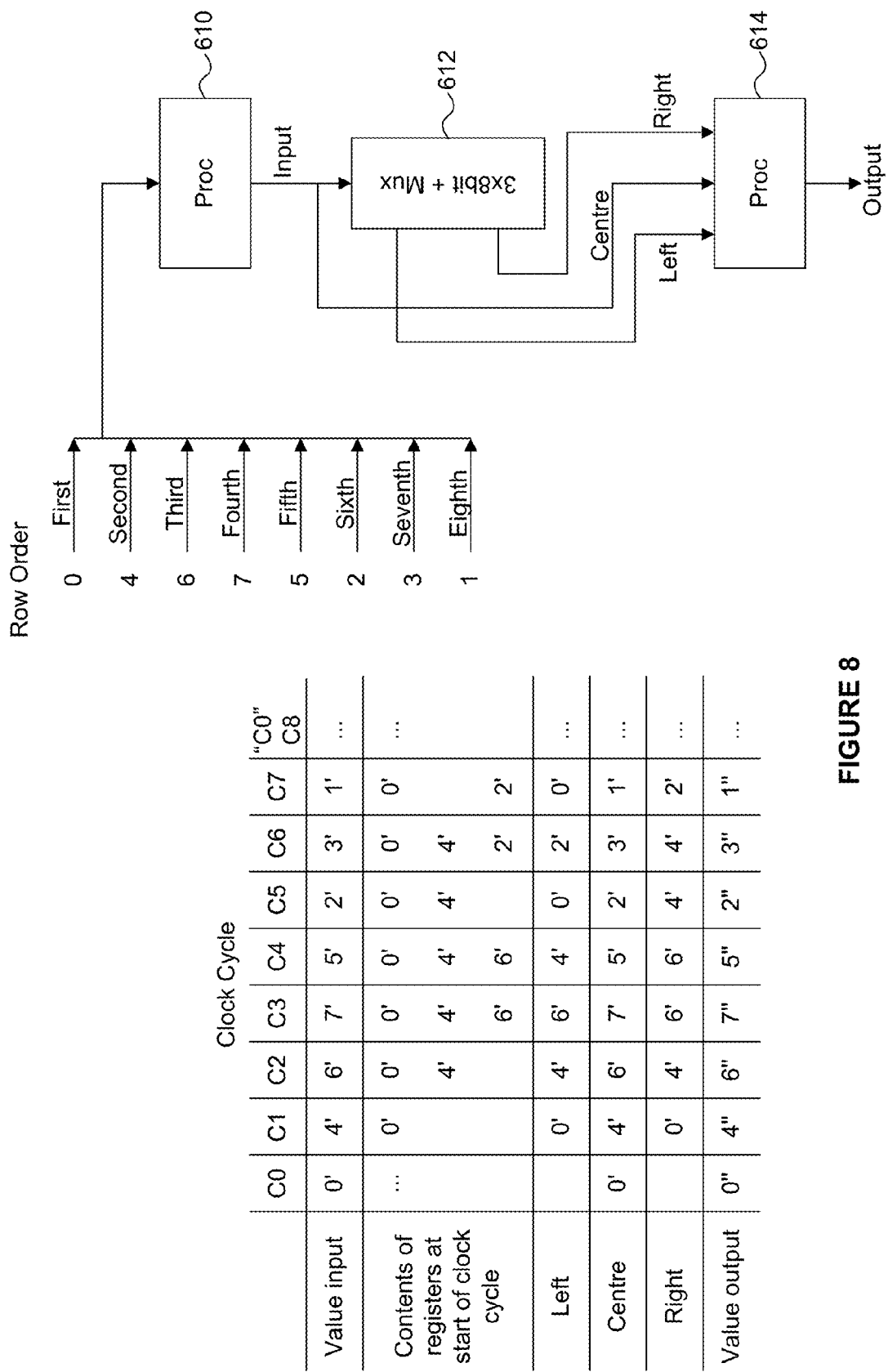
FIG. 8 illustrates the operation of a processing pipeline of the spatial decorrelation module.

FIG. 8 shows an example of the order in which data values from different rows of an 8×8 block are input into the processing pipelines 604. The operation of the second stages 608 of the processing pipelines 604 is summarised in the table shown in FIG. 8. It can be seen that the processing unit 614 has three inputs labelled "Left", "Centre" and "Right" in FIG. 8, whereby the centre input is coupled to the output of the processing unit 610, whereas the left and right inputs are coupled to outputs of the registers 612. On a first clock cycle (clock cycle C0), the second stages 608 of the pipelines 604 receive the first coefficients for row 0 (the value input to the second stage 608 is indicated by a single prime: 0') and output the second coefficients for row 0 (the value output from the second stage 608 is indicated by a double prime: 0"), wherein the storage units store the first coefficients for row 0 (i.e. following clock cycle C0, the registers 612 store the first coefficients for row 0, denoted 0').

On a second clock cycle (clock cycle C1), the second stages 608 of the pipelines 604 receive the first coefficients for row 4 (the value input to the second stage 608 is 4') and output the second coefficients for row 4 (the value output from the second stage 608 is 4"). That is, the processing unit 614 receives 4' on the centre input and receives 0' on the left and right inputs, such that the second coefficients for row 4 (denoted 4") are determined by the processing units 614 based on the received first coefficients for row 4 (denoted 4') and the stored first coefficients for row 0 (denoted 0', retrieved from the registers 612). Following clock cycle C1 the storage units store the first coefficients for rows 0 and 4 (i.e. the registers 612 store the first coefficients for rows 0 and 4, denoted 0' and 4').

On a third clock cycle (clock cycle C2), the second stages 608 of the pipelines 604 receive the first coefficients for row 6 (the value input to the second stage 608 is 6') and output the second coefficients for row 6 (the value output from the second stage 608 is 6"). That is, the processing unit 614 receives 6' on the centre input and receives 4' on the left and right inputs, such that the second coefficients for row 6 (denoted 6") are determined by the processing units 614 based on the received first coefficients for row 6 (denoted 6') and the stored first coefficients for row 4 (denoted 4', retrieved from the registers 612). Following clock cycle C2 the storage units store the first coefficients for rows 0, 4 and 6 (i.e. the registers 612 store the first coefficients for rows 0, 4 and 6, denoted 0', 4' and 6').

On a fourth clock cycle (clock cycle C3), the second stages 608 of the pipelines 604 receive the first coefficients for row 7 (the value input to the second stage 608 is 7') and output the second coefficients for row 7 (the value output from the second stage 608 is 7"). That is, the processing unit 614 receives 7' on the centre input and receives 6' on the left and right inputs, such that the second coefficients for row 7 (denoted 7") are determined by the processing units 614 based on the received first coefficients for row 7 (denoted 7') and the stored first coefficients for row 6 (denoted 6', retrieved from the registers 612). Following clock cycle C3 the storage units store the first coefficients for rows 0, 4 and 6 (i.e. the registers 612 store the first coefficients for rows 0, 4 and 6, denoted 0', 4' and 6').

On a fifth clock cycle (clock cycle C4), the second stages 608 of the pipelines 604 receive the first coefficients for row 5 (the value input to the second stage 608 is 5') and output the second coefficients for row 5 (the value output from the second stage 608 is 5"). That is, the processing unit 614 receives 5' on the centre input, receives 4' on the left input and receives 6' on the right input, such that the second coefficients for row 5 (denoted 5") are determined by the processing units 614 based on the received first coefficients for row 5 (denoted 5') and the stored first coefficients for rows 4 and 6 (denoted 4' and 6', retrieved from the registers 612). Following clock cycle C4 the storage units store the first coefficients for rows 0 and 4 (i.e., the registers 612 store the first coefficients for rows 0 and 4, denoted 0' and 4'). The first coefficient for row 6 (denoted 6') may be discarded because it is not needed for subsequent rows, but it may be simpler to leave 6' in the registers 612 until it is overwritten.

On a sixth clock cycle (clock cycle C5), the second stages 608 of the pipelines 604 receive the first coefficients for row 2 (the value input to the second stage 608 is 2') and output the second coefficients for row 2 (the value output from the second stage 608 is 2"). That is, the processing unit 614 receives 2' on the centre input, receives 0' on the left input and receives 4' on the right input, such that the second coefficients for row 2 (denoted 2") are determined by the processing units 614 based on the received first coefficients for row 2 (denoted 2') and the stored first coefficients for rows 0 and 4 (denoted 0' and 4', retrieved from the registers 612). Following clock cycle C5 the storage units store the first coefficients for rows 0, 4 and 2 (i.e. the registers 612 store the first coefficients for rows 0, 4 and 2, denoted 0', 4' and 2').

On a seventh clock cycle (clock cycle C6), the second stages 608 of the pipelines 604 receive the first coefficients for row 3 (the value input to the second stage 608 is 3') and output the second coefficients for row 3 (the value output from the second stage 608 is 3"). That is, the processing unit 614 receives 3' on the centre input, receives 2' on the left input and receives 4' on the right input, such that the second coefficients for row 3 (denoted 3") are determined by the processing units 614 based on the received first coefficients for row 3 (denoted 3') and the stored first coefficients for rows 2 and 4 (denoted 2' and 4', retrieved from the registers 612). Following clock cycle C6 the storage units store the first coefficients for rows 0 and 2 (i.e. the registers 612 store the first coefficients for rows 0 and 2, denoted 0' and 2'). The first coefficient for row 4 (denoted 4') may be discarded because it is not needed for subsequent rows, but it may be simpler to leave 4' in the registers 612 until it is overwritten.

On an eighth clock cycle (clock cycle C7), the second stages 608 of the pipelines 604 receive the first coefficients for row 1 (the value input to the second stage 608 is 1') and output the second coefficients for row 1 (the value output from the second stage 608 is 1"). That is, the processing unit 614 receives 1' on the centre input, receives 0' on the left input and receives 2' on the right input, such that the second coefficients for row 1 (denoted 1") are determined by the processing units 614 based on the received first coefficients for row 1 (denoted 1') and the stored first coefficients for rows 0 and 2 (denoted 0' and 2', retrieved from the registers 612). It is not important what is stored in the registers 612 following clock cycle C7 because in the subsequent clock cycle, the process repeats with a new block, so the data in the registers 612 for the current block will not be used. The data may be overwritten by data for a new block when such data is to be stored in the registers 612.

In the example, shown in FIG. 8, the registers 612 each store up to three of the first coefficients at any given time, in order to process the data values from a block comprising eight rows of data values. In general, each of the registers 612 will have the capacity to store up to $\log_2(r)$ first coefficients at any given time, where r is the number of rows in the block of data values.

The processing performed by the processing units 614 may be Linear or Haar processing, e.g. depending upon the number of different inputs that are provided in order to determine the second coefficients.

For blocks with a different number of rows (i.e. not eight rows as in the example given above), a skilled person would know how to modify the order of inputting the rows accordingly so that on each clock cycle (except the clock cycle in which the first row of a block is processed), data values can be output for a row based on previously stored rows of data values from the block which have been stored in the registers 612.

The spatial decorrelation modules 204 described above are configured to implement spatial decorrelation along the rows of data values and then along the columns of data values, such that a row of spatially decorrelated values may be output on each of a plurality of consecutive clock cycles. In other examples, the processing of rows and columns may be swapped, such that the spatial decorrelation modules 204 implement spatial decorrelation along the columns of data values and then along the rows of data values, such that a column of spatially decorrelated values may be output on each of a plurality of consecutive clock cycles.

The spatially decorrelated data values (i.e. the second coefficients output from the processing units 614) are output from the spatial decorrelation modules 204 and provided to the corresponding entropy encoding modules 206. An optional step of remapping of the data values output from the spatial decorrelation modules 204 before they are provided to the entropy encoding modules 206 may be performed, e.g. if it is determined that this will improve the entropy encoding process. For example, the data values output from the spatial decorrelation modules 204 may be likely to have values close to zero, or close to the maximum value (e.g. 255 for 8-bit values) due to the spatial decorrelation process, where it is noted that values close to the maximum value are used to represent negative values close to zero. It can therefore be considered that there are two peaks in the distribution of the data values output from the spatial decorrelation modules 204. Entropy encoding may be more efficient when there is just one peak in the distribution of the data values. This can be achieved by remapping the data values, e.g. by moving the sign bit (i.e. the first bit of the value) to the least significant bit position and if the original value was negative then flipping the other bits, but not flipping the other bits if the original value was not negative. In this way the two peaks in the example described above would be grouped together into one peak, allowing more efficient entropy encoding to be performed. The remapping process could be implemented in any suitable manner that improves the efficiency of the entropy encoding process.

As described above, the entropy encoding modules 206 apply entropy encoding to the spatially decorrelated values using a variable-length coding scheme. The coding scheme was chosen to allow for fast encoding, and in particular fast decoding of the data values, at predictable rates. For example, in the examples described in detail herein eight data values are encoded in each of a plurality of consecutive clock cycles according to the entropy encoding scheme and eight data values are decoded in each of a plurality of consecutive clock cycles according to the corresponding entropy decoding scheme.

One example of a suitable entropy coding scheme is a coding scheme based on exponential Golomb coding, and in particular based on the k=0 variant also known as Elias coding. According to this coding scheme, the data values (or "symbols") are encoded into encoded data values, each comprising a prefix of N+1 bits followed by a N bit binary value, where N depends upon the symbol value. In the examples described in detail herein, the prefix bits have a format in accordance with unary coding such that the prefix bits include either: (i) a variable number of zeroes followed by a one, or (ii) a variable number of ones followed by a zero. In other examples the prefix bits may have other formats. Due to the processing of the data values (e.g. colour decorrelation and spatial decorrelation), the distribution of the data values received at the entropy encoding modules 206 tends to be fairly "peaky", which allows for efficient entropy encoding. For example, in the case that remapping is applied to the outputs of the spatial decorrelation modules 204 as described above, the data values received at the entropy encoding modules 206 are more likely to have lower values than higher values, such that e.g. a value of 0 is much more likely than a value of 255. In an example described herein, the Elias coding scheme is slightly modified, and FIG. 10 shows how the different data values (or "symbols") correspond to the modified Elias codes. The values in the table shown in FIG. 10 are shown in big-endian order such that the MSBs are on the left because this is how binary values are normally represented. However, it can be appreciated that the values could have been represented in little-endian order such that the MSBs are on the right, and in fact that may better represent how the data is output, but for ease of human understanding the values are represented in FIG. 10 with the MSBs on the left. The modified Elias codes in the second column of the table in FIG. 10 are written with the prefix first and the binary suffix, in bold, second. The leading prefix bit is underlined in the table shown in FIG. 10. It can be seen that each N-bit suffix exactly matches the N LSBs of the corresponding symbol, which have been indicated in bold in the binary representations of the symbol in FIG. 10. This simplifies the mapping for both entropy encoding and decoding relative to conventional Elias coding. The length of the prefix indicates the length of the suffix.

Since the coefficient '255' would end up in a group in its own, having 17 bits, it has been determined that in the examples described herein, a data value of 255 is not entropy encoded. Instead, if a row includes a data value of 255 then the data values of that row are output as raw data values from the entropy encoder. This avoids the need to output a 17-bit value. Furthermore, the expected probability of a data value being 255 is very low due to the previous colour and spatial decorrelation steps, and may for example be approximately $2^{-17}$ when exponential Golomb coding is used, such that the chances of this data value occurring in a row is expected to be approximately $2^{-11}$. There may be a loss of efficiency when a row of data values are not entropy encoded because one of the data values in the row is 255, but since this occurs very infrequently (e.g. once per $2^{11}$ rows) this loss of efficiency is deemed acceptable.

In examples described in detail herein, the leading bit (i.e. the MSB) of the prefix (which is underlined in FIG. 10) is separated from the remainder of the encoded bits, and the remaining N prefix bits and N suffix bits are interleaved with each other, as shown in the final two columns of the Table in FIG. 10. There is a known relationship between the number of prefix bits and the number of suffix bits in the interleaved bits. In the example shown in FIG. 10, there are the same number of prefix bits and suffix bits in the interleaved bits. Therefore, in the interleaved bits, the even numbered bits will contain purely suffix information while the odd numbered bits will contain purely prefix information. In other examples, the relationship between the number of prefix bits and the number of suffix bits may be different and will depend upon the particular coding scheme used to encode the data values, for example the interleaved bits may include twice as many suffix bits as prefix bits (and may be interleaved into an order: prefix, suffix, suffix, prefix, suffix, suffix, . . . ). The splitting of the encoded data values into a separated leading bit and the interleaved prefix and suffix bits may make negligible difference to the speed at which the entropy encoder can operate, but it may potentially make a huge difference to the speed at which the entropy decoder can operate as described in more detail below. The prefix and suffix bits are separable from each other so that, when decoding, the prefix bits can be analysed to find bit-boundaries without analysing the suffix bits and then the bit-boundaries and the suffix bits can be used to determine decoded data values. This significantly reduces the hardware cost for decoding the data values in a parallel decoder. In the example described above, the prefix and suffix bits are interleaved which allows them to be separable. In other examples, the prefix and suffix bits are not interleaved, and are instead grouped separately into a block of suffix bits and a block of prefix bits which are independently accessible. In other examples, other ways of separating the prefix and suffix bits may be implemented.

As well as showing the encoding of specific symbols, some of the lines in FIG. 10 show general rules for encoding groups of symbols. For example, symbols 1 and 2 are represented in binary as 000000AB, where for a symbol value of 1, AB=01 and for a symbol value of 2, AB=10. The modified Elias code for these symbols has a prefix of 01 and a suffix of B, which is separated into the leading prefix bit 0 and the interleaved bits 1 B. Similarly, symbols 3 to 6 are represented in binary as 00000CDE, where for a symbol value of 3, CDE=011; for a symbol value of 4, CDE=100; for a symbol value of 5, CDE=101; and for a symbol value of 6, CDE=110. The modified Elias code for these symbols has a prefix of 001 and a suffix of DE, which is separated into the leading prefix bit 0 and the interleaved bits 0D1E. Similarly, symbols 7 to 14 are represented in binary as 0000FGHI, where for a symbol value of 7, FGHI=0111; for a symbol value of 8, FGHI=1000; and so on until we get to a symbol value 14 for which FGHI=1110. The modified Elias code for these symbols has a prefix of 0001 and a suffix of GHI, which is separated into the leading prefix bit 0 and the interleaved bits 0G0H1I. The way in which the symbol values are encoded should be apparent from these examples.

Figure 11:
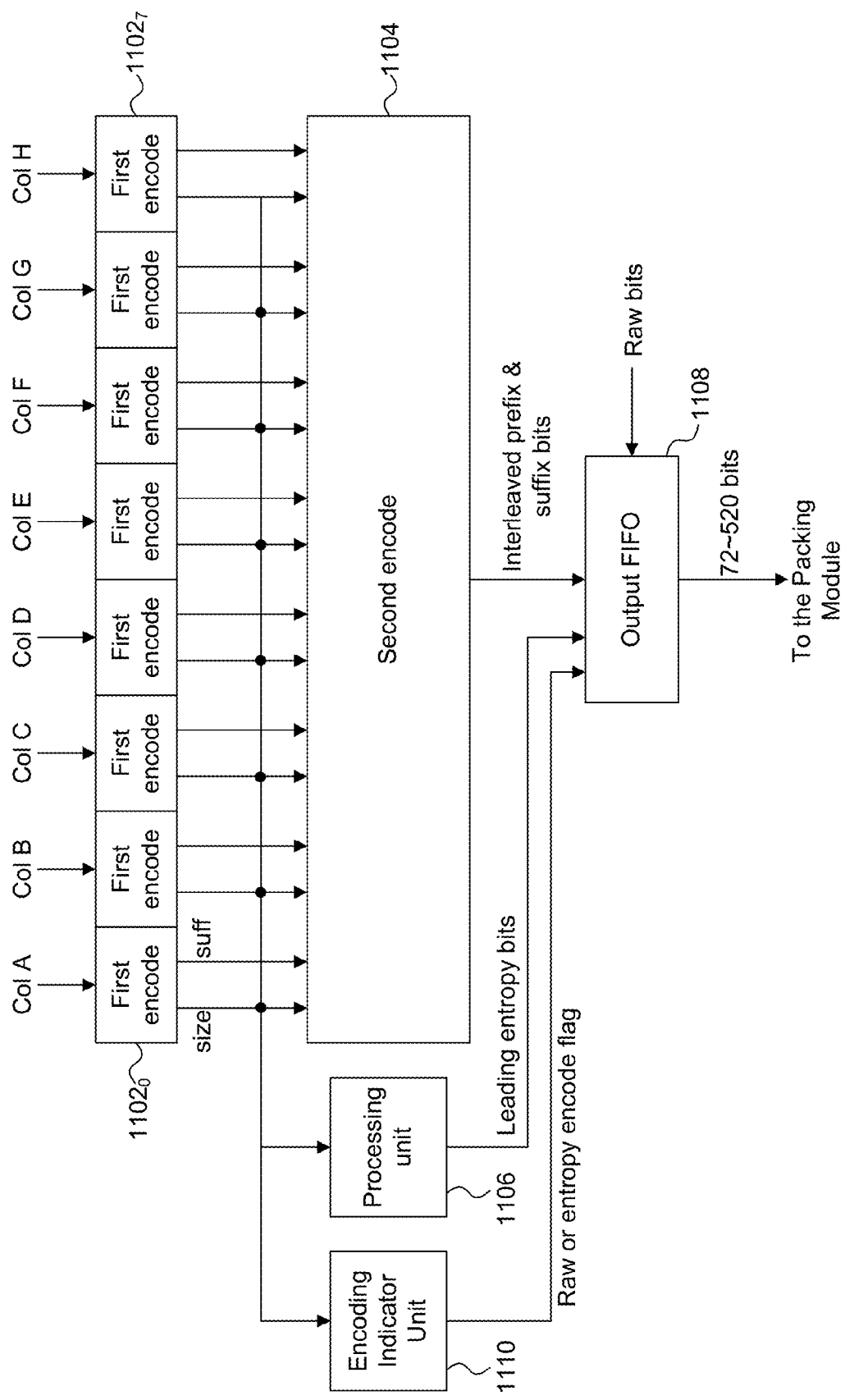
FIG. 11 shows an entropy encoding module.

FIG. 11 shows a more detailed view of one of the entropy encoding modules 206. The entropy encoding module 206 comprises a plurality of first encode units $1102_0$ to $1102_7$ which are configured to receive data values for the respective columns of the data block, which are to be encoded. For clarity, only the encode units $1102_0$ and $1102_7$ are denoted with reference numerals in FIG. 11. The entropy encoding module 206 also comprises a second encode unit 1104, a processing unit 1106, a data store 1108, e.g. implemented as an output First-In-First-Out (FIFO) memory 1108, and an encoding indicator unit 1110.

Figure 12:
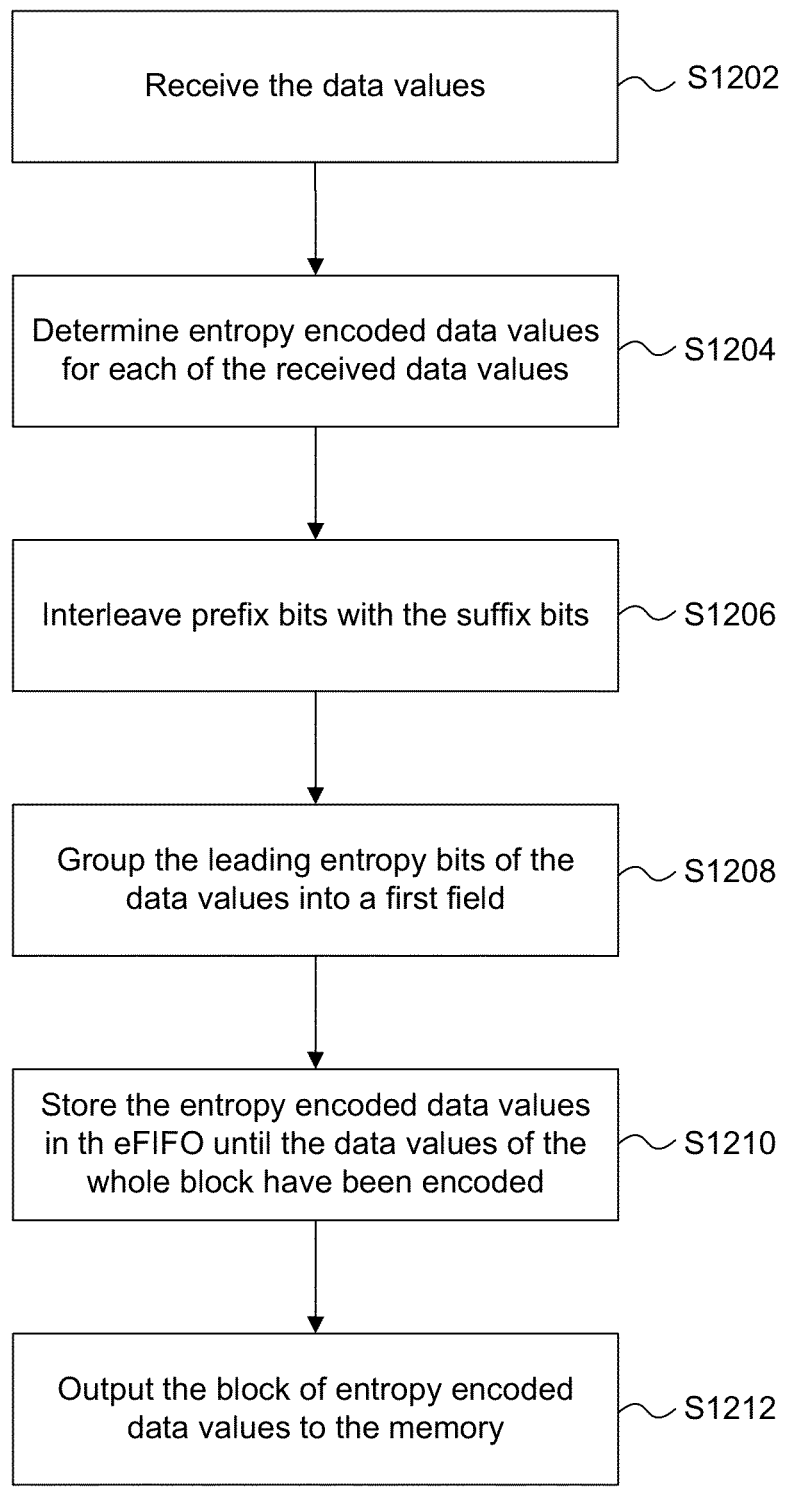
FIG. 12 shows a flow chart for a method of performing entropy encoding on a plurality of data values.

FIG. 12 shows a flow chart for a process of performing entropy encoding on data values at the entropy encoding module 206 to form a sequence of entropy encoded data values. In step S1202 the data values of a row to be encoded are received at the first encode units $1102_0$ to $1102_7$.

In step S1204 the entropy encoded data values for each of the received data values are determined according to the modified Elias coding scheme. In order to do this the first encode units 1102 examine the received entropy encoded data values to determine: (i) an indication of the size of each of the entropy encoded data values, and (ii) the suffix bits for each of the encoded data values. As described above, the N suffix bits can be determined easily since they match the N LSBs of the unencoded data values. The size indications may be in binary format. As an example, the size indications may represent the value of N. Since the total number of bits in the encoded data value excluding the leading bit is always an even number (e.g. 2N), it can be represented by dividing this number by two (e.g. to give N), such that only three bits are needed to represent the size in the example given above for 8-bit data values and modified Elias codes (having N×1 prefix bits and N suffix bits) which have a maximum number of bits of 15 (such that the largest size indication, $N_{max}$, is 7, which can be represented using just three binary bits). The second encode unit 1104 receives the suffix bits and the size indications from each of the first encode units 1102 and generates the prefix bits (excluding the leading bits). The prefix bits are determined based on the size indications of the entropy encoded data values. In step S1206, the second encode unit 1104 interleaves the suffix and prefix bits (excluding the leading bits) as described above and shown in the last column of the table in FIG. 10. The second encode unit 1104 may comprise a plurality of separate processing units which are configured to process the outputs from different ones of the first encode units 1102, such that a whole row of data values can be encoded in each of a plurality of consecutive clock cycles. The interleaving of the suffix and prefix bits means that each of the bit locations in the sequence of entropy encoded data values is predetermined by the entropy coding scheme to include either a first bit or a second bit. This can be achieved in other ways in other examples. For example, if the prefix and suffix bits are not interleaved, and are instead grouped separately into a block of suffix bits and a block of prefix bits which are independently accessible, each of the bit locations in the sequence of entropy encoded data values is predetermined by the entropy coding scheme to include either a first bit or a second bit. This allows the first and second bits in the sequence of entropy encoded data values to be separated during entropy decoding simply based on the bit locations of the bits, as described in more detail below.

In step S1208 the size indications are provided from the first encode units 1102 to the processing unit 1106, and the processing unit 1106 determines and groups the leading bits of the encoded data values into a first field in accordance with the entropy coding scheme being used. As described in relation to the example given above, the prefix bits (excluding the leading bits) and the suffix bits are interleaved with each other in an alternating manner and included in a second field. As can be appreciated by looking at the table in FIG. 10, according to the modified Elias coding scheme used in the examples described in detail herein, if a size indication is zero then the unencoded data value is zero and the encoded data value will have a single prefix bit of 1 and no suffix bits, such that the leading bit is a 1. However, according to the modified Elias coding scheme used in the examples described in detail herein, if the size indication is not zero then the unencoded data value is not zero and the encoded data value will have a prefix with more than one bit such that the leading bit (i.e. the MSB of the prefix) will be a 0. Therefore the determination of the leading bit in the processing unit 1106 may be implemented simply by determining whether the size indications are zero or non-zero.

The encoding indicator unit 1110 receives the size indications and sets an indicator to indicate the coding scheme used to encode the data values. In a simple example, the indicator may be a single bit for each row indicating whether the data for that row is to be entropy encoded or output as raw data (i.e. not entropy encoded). For example, the coding scheme used may be determined based on whether the size indications for the entropy encoded data values indicate that the entropy encoded data values of a row will use fewer bits than the raw data values of the row (i.e. based on whether fewer than 64 bits are to be used for the eight entropy encoded data values of the row in the example in which the unencoded data values each have eight bits).

The encoded data values (including interleaved prefix and suffix bits from the second encode unit 1104 and the leading bits from the processing unit 1106) of the rows are sent to the output FIFO 1108 and are stored therein in step S1210. On each of a plurality of consecutive clock cycles a row of encoded data values are stored in the output FIFO 1108 until all of the data values within a block of encoded data values (e.g. 8 rows) have been encoded. Then, in step S1212, the block of encoded data values is output from the output FIFO 1108 and sent to the packing module 208, where the encoded data values from each of the colour channels are packed together. In this way, a sequence of encoded data values has been formed. The encoded data block can then be sent for storage in the memory 106, e.g. via the memory interface 114.

As described above, if the encoded data values for a row are not going to comprise fewer bits than the raw (i.e. unencoded)

data values then the raw data values are output instead of the entropy encoded data values. The indicator (raw or entropy encode flag) output from the encoding indicator unit 1110 is provided to the output FIFO 1108. The output FIFO 1108 also receives the raw bits (i.e. the bits of the row that were received at the first encode units $1102_0$ to $1102_7$). The raw data for an 8×8 block of 8-bit data values comprises 512 bits, so if the output FIFO 1108 determines that the block of encoded data values comprises ≥512 bits (which is unlikely but possible) then the output FIFO 1108 may output the raw data bits rather than the block of encoded data values.

Figures 15, 16:
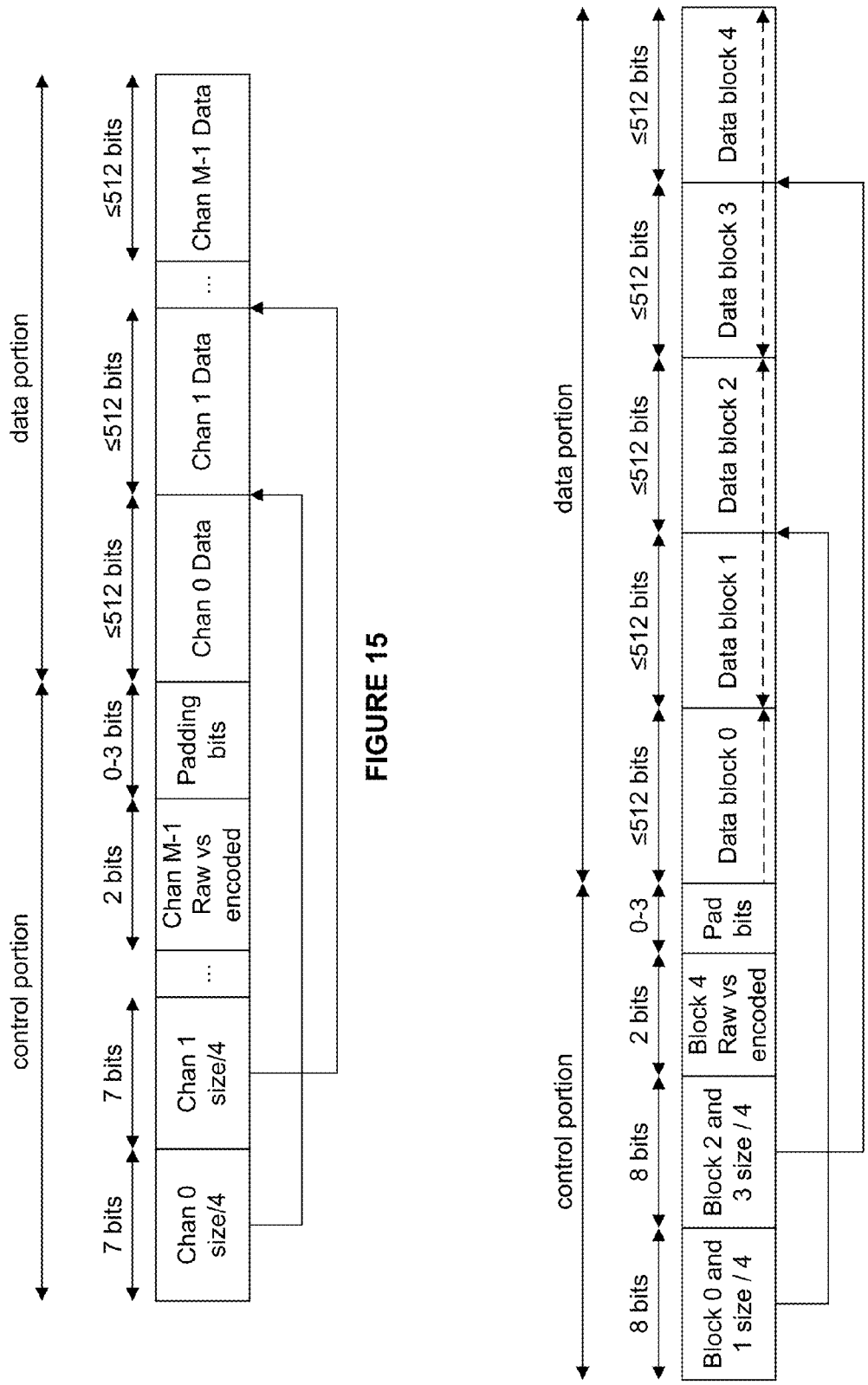
FIG. 15 represents a first data packet comprising blocks of encoded data values.
FIG. 16 represents a second data packet comprising a plurality of data blocks.

FIG. 15 represents a data packet into which the packing module 208 may pack an 8×8 block of encoded data values (wherein the unencoded data values each comprise 8 bits per colour channel) which have been encoded as described above. The data of each of the colour channels (e.g. R, G, B and A channels) comprise up to 512 bits and are stored in respective blocks in a data portion of the data packet. In the example shown in FIG. 15, where there are M colour channels, for channels 0 to M-2 there are respective size indicators (e.g. of 7 bits each) to indicate the number of bits of data for the respective channel. The size indicators are used to determine the starting position of the data of each of the channels and to determine the format of the data of the channels. For example, the channel 1 data will start at the bit position given by the offset from the start of the data portion corresponding to the size of channel 0. It is not necessary to have a size indicator for channel M-1 since there are no subsequent channels. However, the format of the data of channel M-1 still needs to be indicated, so two bits are included in the control portion to indicate the format of the data of channel M-1. Some number of padding bits (e.g. between 0 and 3) are included in the control portion to ensure that the data portion starts at a bit position which is divisible by four. The exact sizes of the channel data blocks may be given by 9 bit size indicators (that is, 9 bits may be needed to exactly represent a size from 1 to 512 bits). However, as shown in FIG. 15 the size indicators are given by dividing the size by four such that only 7 bits are used. It can be appreciated that the entropy encoding scheme described above will always use an even number of bits and so only eight bits would be needed to exactly represent the size of the channel data blocks. Furthermore, the channel data blocks may include padding bits (which are not explicitly shown in FIG. 15) to pad the channel data blocks up to the nearest multiple of four bits, such that all of the channel data blocks start at a position which is a multiple of four bits. Assuming equal probability, this means that 50% of the time we will waste two bits. On average, therefore, the scheme wastes one bit of storage, which exactly balances the saving of one bit in the size indicators (i.e., the reduction from 8 to 7 bits). However, because (a) the summation of the sizes and (b) the muxing/shifting used to select the channel data, are reduced, this scheme is simpler/cheaper to implement than using 8 bits for the size indicators.

To identify the special case of the channel data being stored in a raw form (which effectively means the entropy encoded data was >508 bits) a size value of "0" may be used. The smallest standard entropy encoded data is 74-bits in size which corresponds to a (rounded up) size indicator of 19 (since 19×4=76). Therefore, size indicators between 1 and 18 inclusive could be used to indicate other special cases. For example, a size indicator of 2 may indicate that the data values in the data block of the channel have a constant value and the size of the channel data block in the data portion is eight bits. As described above, for the final channel (channel M-1), it is unnecessary to know its exact size as it is not necessary to locate the data stored after it, but an indicator is used to indicate the format of the data in channel M-1, e.g. whether it is in a raw format, encoded with the entropy scheme, or a constant, and as such two bits are used to indicate this format.

Similar data structures may be used when different sized data blocks (e.g. not 8×8 blocks) are encoded and/or when each data value is represented using a different number of bits (e.g. not 8 bits).

Furthermore, in another example, the number of size indicators may be halved by making each size indicator indicate the size of a pair of channels. Any reduction in the number of bits used to store the control data may be a benefit in a data compression scheme, so reducing the number of size indicators used may be beneficial. For example, a first size indicator may indicate the combined size of channels 0 and 1, and a second size indicator may indicate the combined size of channels 2 and 3, etc. In this case, the data blocks for the odd channels may be included in the data portion in reverse bit-order, whilst the data blocks for the even channels may be included in the data portion in forward bit-order. In this way, for the even channels the size indicators can be used to indicate the start of the channel data, and the even channels can be read out in the same way as before, by adding up the size of the previous channels to determine the start of the channel data. However, for the odd channels the size indicators can be used to indicate the end of the block of channel data. Since the data blocks of the odd channels are in reverse bit-order, the end of the block of the channel data indicates the start of the channel data, i.e. the first bit of the channel data. The channel data of the odd channels can then be read according to the reverse bit-order (i.e. "backwards") from the end point of the block of channel data. Since the channel data for odd channels has been stored in reverse bit-order in the data packet then the channel data is read out correctly. In this way, the position of the first bit of the data in the odd channels is determined from the position of the next even channel.

The method of storing fewer (e.g. half) of the size indicators can be used for any type of data that is stored in a data packet wherein different blocks of data are included in the data packet. Size indicators are an example of indicators which indicate the starting bit position of the data blocks in the data packet, but more generally, any suitable indicators may be used. At least one of the indicators may indicate a particular starting bit position for a pair of the data blocks in the data packet. A first data block of the pair of data blocks may be included in reverse bit-order in the data packet with the first bit of the first data block being positioned in the data packet in accordance with the indicated particular starting bit position. A second data block of the pair of data blocks may be included in forward bit-order in the data packet with the first bit of the second data block being positioned in the data packet in accordance with the indicated particular starting bit position. The indicators are included in the data packet, e.g. in a control portion of the data packet, whilst the data blocks are included (e.g. in a contiguous manner) in a data portion of the data packet. In order to read the data blocks from the data packet the indicators are used to determine the starting bit position of the data blocks in the data packet, and the data blocks are read from the data packet in accordance with the determined starting bit position of the data blocks.

FIG. 16 shows an example in which there are five data blocks, (e.g. which represent data for different channels) labelled data block 0 to data block 4 included in a data portion of the data packet. There are just two indicators in the control portion, which indicate the bit positions of the boundaries between data blocks 1 and 2 and between data blocks 3 and 4. The dotted lines show the order in which the bits of the data blocks are arranged. In particular, the even data blocks (data blocks 0, 2 and 4) are included in forward bit-order whilst the odd data blocks (data blocks 1 and 3) are included in reverse bit-order. In order to read data block 0, the first bit can be found at the start of the data portion of the data packet. In order to read data block 1, the first indicator (indicating the combined size of data blocks 0 and 1) is used to find the boundary between data blocks 1 and 2. The first bit of data block 1 is found at this bit position (or e.g. one bit before this bit position) and then the data block 1 can be read out in reverse order from that bit position. In order to read data block 2, the first indicator (indicating the combined size of data blocks 0 and 1) is used to find the boundary between data blocks 1 and 2. The first bit of data block 2 is found at this bit position (or e.g. one bit after this bit position) and then the data block 2 can be read out in forward order from that bit position. The odd data blocks (including data block 3) are read out as described above for data block 1. The even data blocks (including data block 4) are read out as described above for data block 2. In this example, the bit order of the data blocks (i.e. forward or reverse) is determined simply by determining whether the data block is odd or even before reading out the data block.

In this way the number of bits used for the indicators is reduced as compared to a data packet such as that shown in FIG. 15 in which there is an indicator for each boundary between data blocks in the data portion of the data packet. In the example shown in FIG. 16 all of the indicators in the control portion of the data packet indicate the starting bit position for a pair of data blocks and as such half the number of indicators are used in the control portion, thereby reducing the amount of data included in the data packet. It is not significantly more complex (if at all) to include or read the data blocks in reverse bit-order compared to including or reading the data blocks in forward-bit order. It is the packing module 208 that forms the data packet, and it is the unpacking module 408 that reads the data blocks from the data packet. It is noted that if the last channel is an odd channel then there won't be a channel after the last odd channel, and the last size indicator will indicate the end of the data packet. For example, if data block 4 wasn't included in the data packet shown in FIG. 15 then we would still need the size indicator for blocks 2 and 3 which would point to the end of block 3 in order to find the start of the data in data block 3.

Figure 17:
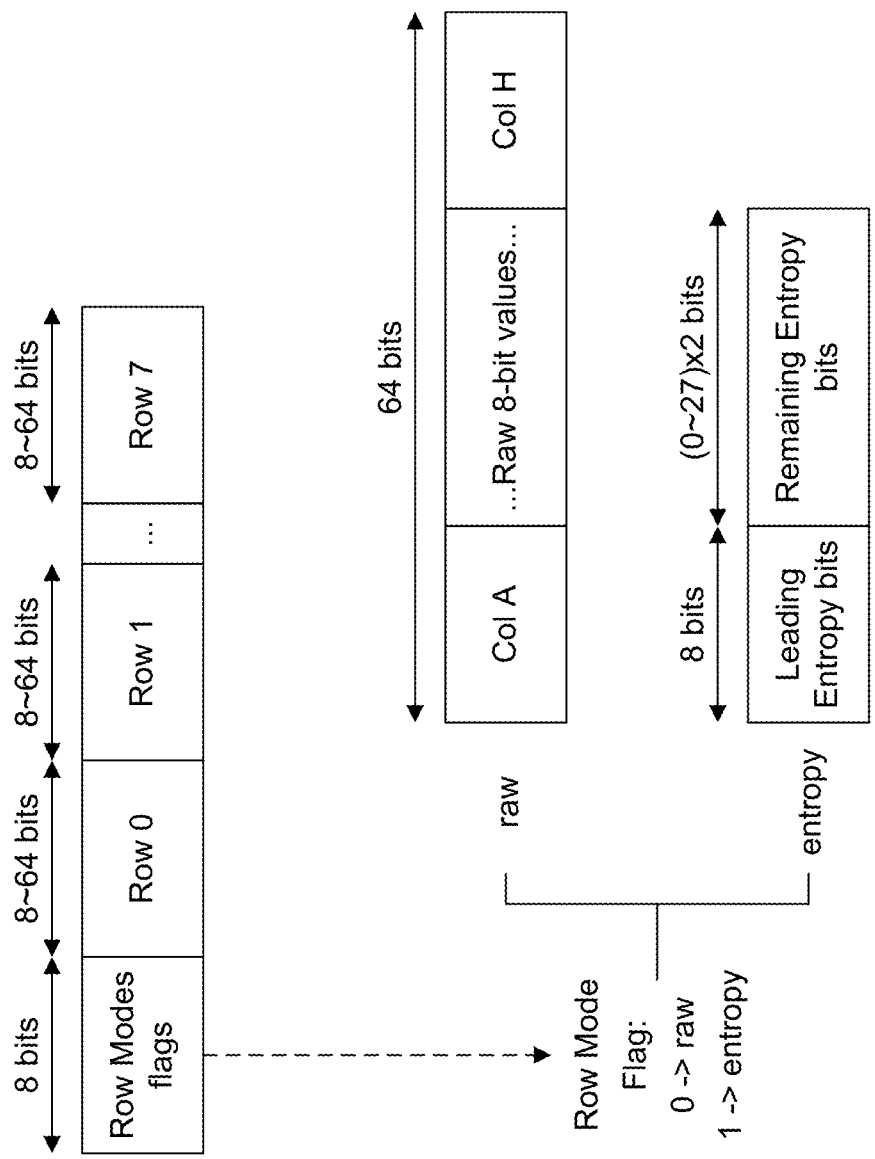
FIG. 17 illustrates how the data of a channel is stored in the block of encoded data values.

FIG. 17 illustrates how the data of a channel is stored in a data block of encoded data values in the example of an 8×8 block of 8 bit data values. The channel data comprises a block of data for each of the rows (which has between 8 and 64 bits) and a row mode flag for each of the rows which indicates whether the data values of the respective rows are in raw format or have been entropy encoded. In particular, in the example shown in FIG. 17, if the row mode flag for a particular row is a 0 then the data values of that row are in raw format and the data for that row comprises eight raw data values having eight bits each in this example. However, if the row mode flag for a particular row is a 1, in the example shown in FIG. 17, then the data values of that row are entropy encoded and as such include eight leading entropy bits and between 0 and 54 interleaved prefix and suffix bits as described above.

Figure 13:
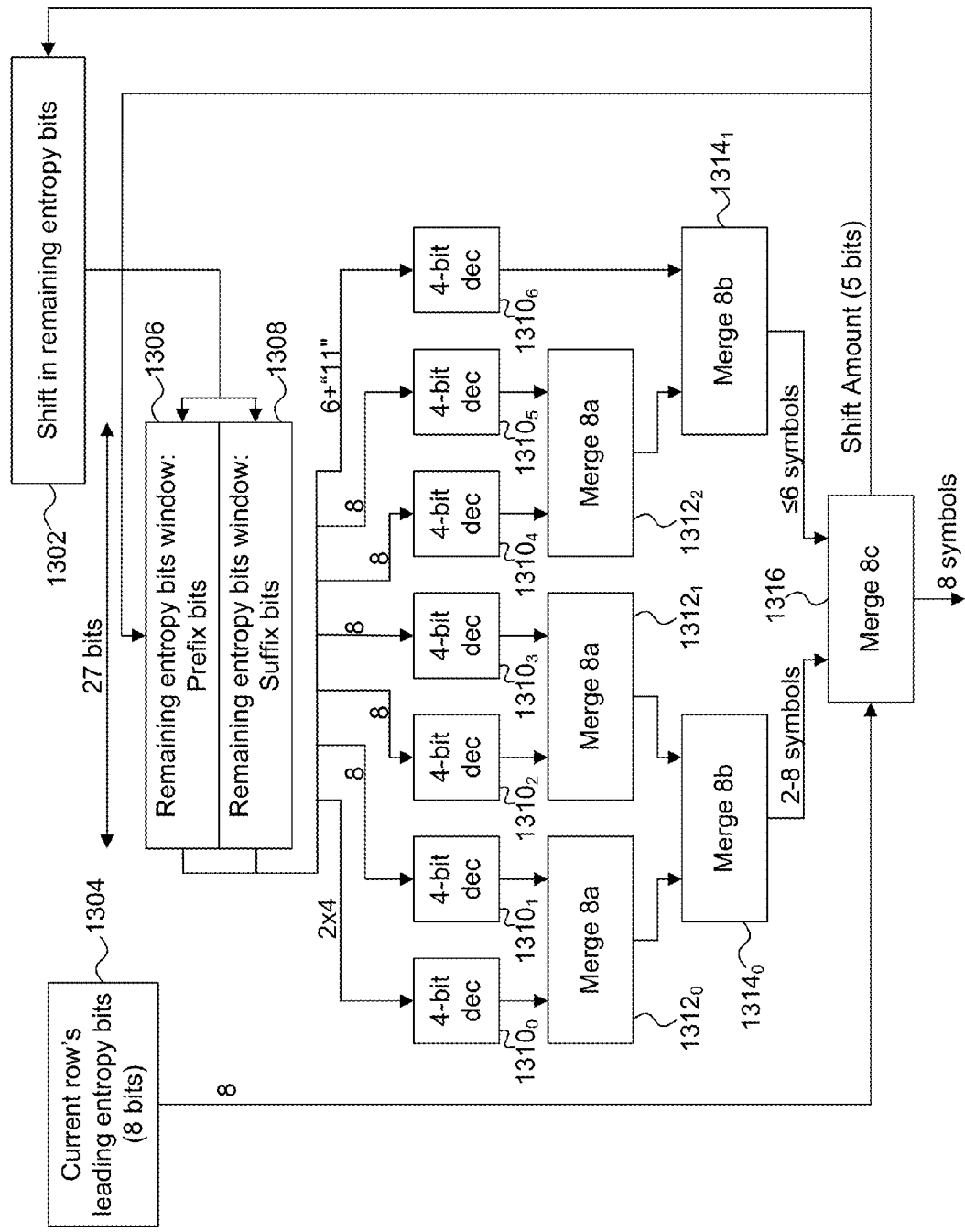
FIG. 13 shows an entropy decoding module.

FIG. 13 illustrates any one of the entropy decoding modules 406 which is used to perform entropy decoding on a plurality of entropy encoded data values which have been entropy encoded as described above. The entropy decoding module 406 comprises a shift unit 1302, a leading entropy unit 1304, a prefix bit window 1306, a suffix bit window 1308, seven parallel decode units $1310_0$ to $1310_6$, three first-level merging units $1312_0$ to $1312_2$, two second-level merging units $1314_0$ and $1314_1$ and a third-level merging unit 1316. An output of the shift unit 1302 is coupled to inputs of the prefix bit window 1306 and the suffix bit window 1308. Seven outputs of the prefix and suffix windows 1306 and 1308 are coupled to respective inputs of the seven parallel decode units $1310_0$ to $1310_6$. Outputs of the first and second decode units $1310_0$ and $1310_1$ are coupled to inputs of the first of the first-level merging units $1312_0$. Outputs of the third and fourth decode units $1310_2$ and $1310_3$ are coupled to inputs of the second of the first-level merging units $1312_1$. Outputs of the fifth and sixth decode units $1310_4$ and $1310_5$ are coupled to inputs of the third of the first-level merging units $1312_2$. Outputs of the first and second of the first-level merging units $1312_0$ and $1312_1$ are coupled to inputs of the first of the second-level merging units $1314_0$. Outputs of the third of the first-level merging units $1312_2$ and the seventh decode unit $1310_6$ are coupled to inputs of the second of the second-level merging units $1314_1$. Outputs of the first and second of the second-level merging units $1314_0$ and $1314_1$ are coupled to inputs of the third-level merging unit 1316. An output of the leading entropy unit 1304 is coupled to an input of the third-level merging unit 1316. A first output of the third-level merging unit 1316 is provided as an output of the entropy decoding module 406. A second output of the third-level merging unit 1316 is coupled to an input of the prefix and suffix bit windows 1306 and 1308. A third output of the third-level merging unit 1316 is coupled to an input of the shift unit 1302.

Figure 14:
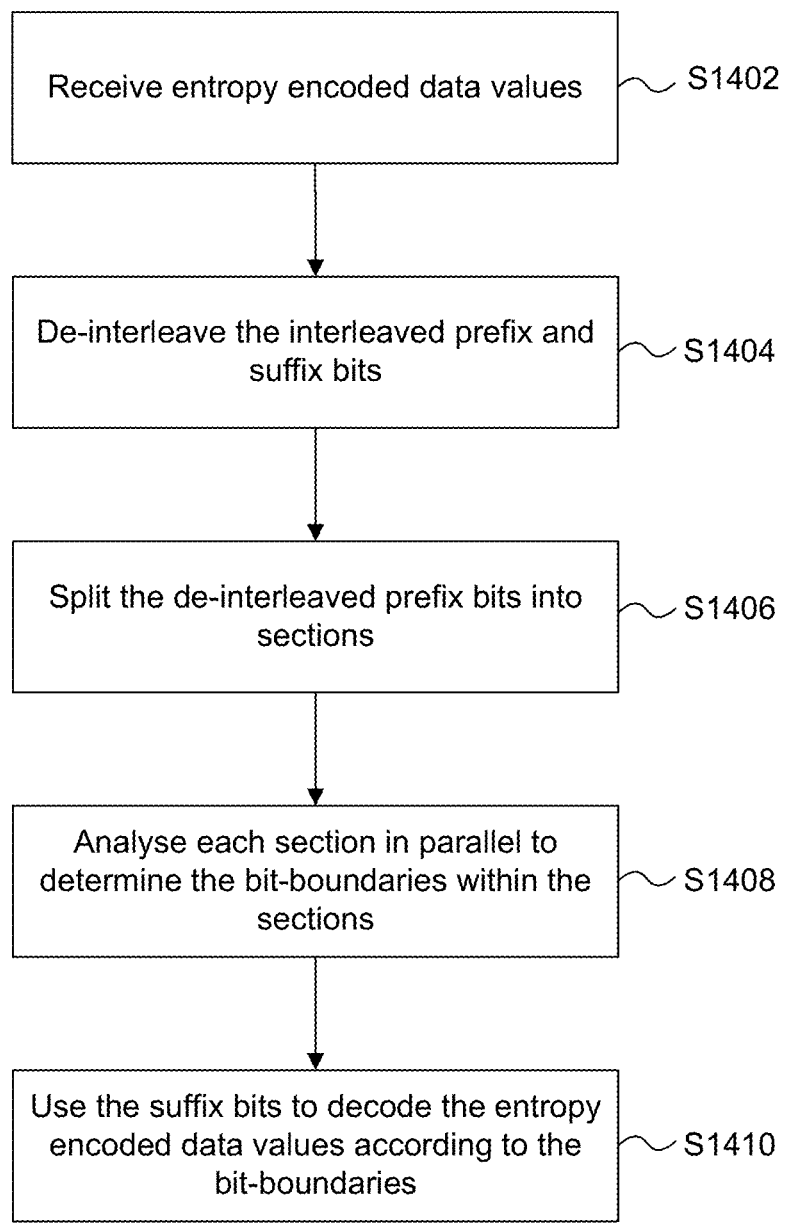
FIG. 14 shows a flow chart for a method of performing entropy decoding on a plurality of entropy encoded data values.

The operation of the entropy decoding module 406 is described with reference to the flow chart shown in FIG. 14. In step S1402 a block of data is received at the entropy decoding module 406. If the data values are in raw format then the data values bypass the units of the entropy decoding module 406 shown in FIG. 13 and the raw data values are output from the entropy decoding module 406 to the corresponding reverse spatial decorrelation module 404. However, if the received data values are entropy encoded (as indicated by the row mode flags shown in FIG. 17) then the entropy decoding module 406 performs entropy decoding on the received data values, as described below with reference to the steps shown in the flow chart of FIG. 14.

The entropy encoded data values of a row are received at the entropy decoding unit 406, and the leading entropy bits of the entropy encoded data values are provided to the leading entropy unit 1304. In step S1404 the remaining, interleaved prefix and suffix bits (i.e. the bits other than the leading bits) are de-interleaved in accordance with the entropy coding scheme used to encode the data values and the prefix bits are provided to the prefix bit window 1306 whilst the suffix bits are provided to the suffix bit window 1308. It is noted that in examples in which the prefix and suffix are not interleaved when they are encoded, then they do not need to be de-interleaved in step S1404, and instead can be provided to the prefix bit window 1306 and the suffix bit window 1308 accordingly. Therefore, in general, the first bits of the entropy encoded data values are separated from the second bits of the entropy encoded data values based on the bit locations of the bits (e.g. and not based on an analysis of the values of those bits) in the sequence of entropy encoded data values in accordance with the entropy coding scheme. In the example shown in FIG. 13, the prefix bit window 1306 and the suffix bit window 1308 are both 27 bits long. In this way, the prefix and suffix bits for a whole entropy encoded row can be stored in the windows 1306 and 1308. It is noted that the maximum number of bits that would be used for an entropy encoded row is 62 bits (62 bits=8 leading prefix bits+27 other prefix bits+27 suffix bits), because if more bits are needed for entropy encoding then raw data values will be used instead for the row, which uses 64 bits. According to the entropy coding scheme described in detail in examples above, the number of prefix bits (minus the leading entropy bits) is the same as the number of suffix bits, so the number of bits (e.g. N) provided to the prefix bit window 1306 is the same as the number of bits (e.g. N) provided to the suffix bit window 1308 for each of the data values. In the example described above in which the leading entropy bits are grouped together into a first field and the remaining prefix and suffix bits are interleaved with each other in an alternating manner in a second field, the de-interleaving of the prefix and suffix bits from the second field comprises splitting the odd bits from the even bits of the data in the second field to thereby form a stream of prefix bits and a corresponding stream of suffix bits which are provided to the prefix bit window 1306 and the suffix bit window 1308 respectively.

In each of a plurality of consecutive clock cycles, a row of entropy encoded data values (e.g. eight entropy encoded data values) are processed by the entropy decoding module 406. With reference to the example of the coding scheme shown in FIG. 10, it can be seen that if a leading entropy bit is '1' then that indicates that the data value is 0 and there will be no prefix or suffix bits provided to the prefix and suffix bit windows 1306 and 1308 for those data values. However, for other entropy encoded data values, which have leading entropy bits of '0' such that prefix and suffix bits are provided respectively to the prefix and suffix bit windows 1306 and 1308, prefix bits of '1' in the prefix bit window 1306 indicate the end of an entropy encoded data value, whilst prefix bits of '0' indicate that there are more prefix bits in a particular entropy encoded data value.

In step S1406 the de-interleaved prefix bits (and the de-interleaved suffix bits) are split into sections (e.g. each section comprising four prefix bits and four suffix bits), and each section is provided to a respective one of the decode units 1310. This is indicated in full in FIG. 13 for decode unit 1310$_0$ which shows "2×4" bits going to the decode unit 1310$_0$ (i.e. four prefix and four suffix bits). The same is true for the other decode units 1310$_1$ to 1310$_6$, but to avoid cluttering the Figure this is shown in shorthand in FIG. 13 as "8" bits rather than "2×4" bits.

In step S1408 each of the decode units 1310 analyses the prefix bits to determine bit-boundaries between the entropy encoded data values. By determining the bit-boundaries between the entropy encoded data values, the lengths of the entropy encoded data values are determined. In particular, in the example using the coding scheme shown in FIG. 10, the decode units 1310 identify prefix bits having a value of '1' since this indicates a bit-boundary in the prefix bits. Since in this example, the number of prefix bits (minus the leading entropy bits) is the same as the number of suffix bits (e.g. N), then the bit-boundaries in the prefix bits are the same as the bit-boundaries in the suffix bits. If other coding schemes are used, then the bit boundaries in the suffix bits may be determined based on other relationships between the numbers of prefix and suffix bits for each of the entropy encoded data values, as determined by the particular entropy coding scheme.

In step S1410 the suffix bits and the determined bit-boundaries are used to decode the entropy encoded data values in accordance with the particular entropy coding scheme that was used to encode the data values. In particular, for any of the data values which finish within a decode unit 1310 (as indicated by a '1' in the prefix bits), that decode unit 1310 outputs a candidate decoded symbol value using the suffix bits that it is access to. However, since a decode unit 1310 might not have access to all of the suffix bits of a particular symbol (because the previous decode unit(s) 1310 might have received some of the suffix bits of the particular symbol, the candidate decoded symbol value might not be the final decoded symbol value. The merging units 1312, 1314 and 1316 ensure that the final decoded symbol values take account of all of the bits of the symbols. As described above, the entropy coding scheme is chosen such that the decoded symbols are easily determined using the suffix bits since the N LSBs of the binary representation of the decoded symbols are the same as the N bits as the binary bits of the suffix of the encoded data values. The decode units 1310 also output carry out bits for data values which start but do not finish within the decode unit 1310. The carry out bits are the suffix bits of the data values received at the decode unit 1310 which do not finish within the decode unit 1310. The carry out bits allow the merging units 1312 to combine the outputs of the decode units 1310 to determine data values whose bits have been passed to more than one of the decode units 1310.

By way of example, if a decode unit 1310 receives the four prefix bits [0100], then reading from left to right, it can determine that the first two prefix bits are the final two prefix bits (but not necessarily the only two prefix bits) of one data value and the next two prefix bits are the start (but not the end) of the next data value. The four suffix bits received at the decode unit 130 may be denoted as [$S_0,S_1,S_2,S_3$]. The decode unit 1310 outputs a candidate decoded symbol value as [$S_0, S_1$] and an indicator which can be used by the subsequent merging unit 1312 which indicates the length of the candidate decoded symbol value (e.g. in this example as 2 bits). [$S_0,S_1$] will be the final two bits of the decoded data value but the merging units 1312, 1314 and 1316 still need to determine the rest of the bits (e.g. the other six bits in an example using 8-bit data values) of the decoded data value. The bits $S_2$ and $S_3$ are not the final suffix bits of a data value (because the final prefix bits in this example are both zero). So the carry out bits from the decode unit 1310 comprise $S_2$ and $S_3$, and an indicator is output form the decode unit 1310 to the subsequent merging unit 1312 which indicates the length of the carry out bits (e.g. in this example as 2 bits). The merging unit 1312 can then combine the suffix bits $S_2$ and $S_3$ with the output of another decode unit 1310 in order to determine the decoded data values.

The merging units 1312, 1314 and 1316 combine the results of the analysis of the sections to determine all of the decoded data values for a row. In particular, the merging unit 1312$_0$ receives the candidate decoded symbols and/or the carry out bits from the two decode units 1310$_0$ and 1310$_1$ and combines them to then output further candidate decoded symbols and/or carry out bits to the merging unit 1314$_0$. For example, the carry out bits from the decode unit 1310$_0$ are combined with the first output bits from the decode unit 1310$_1$ to thereby determine a candidate decoded value for a symbol whose encoded bits fell partly in the section processed by the decode unit 1310$_0$ and partly in the section processed by the decode unit 1310$_1$.

Following on from the example given above, the merging unit 1312$_0$ may receive from the decode unit 1310$_0$ a candidate decoded symbol which has two bits, e.g. [$S_0,S_1$] and two carry out bits [$S_2,S_3$], with indications of the lengths of the candidate decoded symbol and the carry out bits. The merging unit may also receive from the decode unit 1310$_1$ two candidate decoded symbols which respectively have one and three bits, [$S_4$] and [$S_5,S_6,S_7$]. The merging unit 1312$_0$ will combine the carry out bits [$S_2,S_3$] from the decode unit 1310$_0$ with the bit $S_4$ of the first candidate decoded symbol output from the decode unit 1310$_1$. Therefore, in this example, the merging unit 1312$_0$ has determined three candidate decoded symbols with final bits of [S₀,S₁], [S₂,S₃,S₄] and [S₅,S₆,S₇] respectively. The decoded data symbols in this example have eight bits, so the merging unit $1312_0$ will need to add bits to the candidate decoded symbols such that they have eight bits. It can be seen from FIG. 10 that the bits of the decoded symbols include a number of suffix bits (denoted S) and (8-S) other bits. The first (8-S-1) of the other bits are zeroes. The last bit of the other bits (i.e. the right most bit of the other bits of the symbols) is a zero if all of the suffix bits are ones, and the last bit of the other bits is a one if it is not the case that all of the suffix bits are ones. In this way the merging unit $1312_0$ can determine the decoded symbols by combining the carry out bits from the decode unit $1310_0$ with the bits of the first candidate decoded symbol from the decode unit $1310_1$ to determine a decoded symbol.

The merging unit $1312_1$ processes the outputs from the decode units $1310_2$ and $1310_3$, and the merging unit $1312_2$ processes the outputs from the decode units $1310_4$ and $1310_5$ in a corresponding manner to the processing of the outputs from the decode units $1310_0$ and $1310_1$ by the merging unit $1312_0$ as described above.

There may be some data values whose bits fall partly into more than one of the merging units 1312. Therefore, further layers of merging units 1314 and 1316 are used to combine all of the bits of the row together to ensure that the bits are decoded correctly. For example, the merging unit $1314_0$ combines the outputs of the merging units $1312_0$ and $1312_1$ and outputs between two and eight decoded symbols and optionally some carry out bits. Also similarly, the merging unit $1314_1$ combines the outputs of the merging unit $1312_2$ and the decode unit $1310_6$ and outputs up to six decoded symbols. The merging unit $1314_1$ may or may not output any carry out bits because there are no subsequent bits for such carry out bits to be combined with in the current row, but such carry out bits may be useful for processing subsequent rows of data values.

The merging unit 1316 then combines the outputs of the merging units $1314_0$ and $1314_1$ with the leading entropy bits from the leading entropy unit 13104 to determine and output the eight decoded data values (or "symbols") of the row.

It is noted that the determination of the bit-boundaries between the received entropy encoded data values does not comprise analysing the suffix bits. The number of bits that need to be considered when determining the bit-boundaries is reduced (e.g. halved) because the suffix bits are not considered. The determination of the bit boundaries between entropy encoded data values can be performed in parallel (e.g. in the decode units 1310) for the different data values of a row since: (i) only the prefix bits are considered for this purpose, and (ii) the format of the prefix bits means that any '1's in the prefix bits indicate bit-boundaries. Therefore, to find bit-boundaries the decode units 1310 simply find 1's in the prefix bits. Therefore, a sequential nature of the processing of the variable-length entropy encoded data values is avoided by removing the suffix bits from the determination of the bit-boundaries. This allows a plurality of entropy encoded data values to be decoded on each iteration (e.g. on each of a plurality of consecutive clock cycles).

The method steps described above with reference to the flow chart of FIG. 14 are iterated on each of a plurality of consecutive clock cycles. For example, a row of entropy encoded data values (e.g. eight entropy encoded data values) are decoded on each of the clock cycles.

In the examples described above, for any given entropy encoded data value, the number of prefix bits is N+1 and the number of suffix bits is N. In more general examples, the relationship between the number of prefix bits and the number of suffix bits for any given entropy encoded data value is such that the number of prefix bits is (N+a) and the number of suffix bits is kN, where a is a constant which describes the number of leading bits which are to be treated differently to the other remaining prefix bits, as described in detail in the examples above in which a=1; and k is a constant which describes the number of suffix bits that are included for each of the remaining prefix bits. In the examples described in detail above k=1.

For example, an encoding scheme could be used in which a=0 and k=1, such that the entropy encoded data values have an even length with the number of prefix bits equaling the number of suffix bits. With a=0 there are no leading prefix bits, and all of the prefix bits are treated in the same way. An example of the prefix and suffix bits which could be used to encode different symbols in this case is given in Table 1.

TABLE 1

| Symbol | Binary Representation of symbol | Prefix | Suffix |
|---|---|---|---|
| 0 | 0000 0000 | 1 | 0 |
| 1 | 0000 0001 | 1 | 1 |
| 2 | 0000 0010 | 01 | 10 |
| 3 | 0000 0011 | 01 | 11 |
| 4 | 0000 0100 | 01 | 00 |
| 5 | 0000 0101 | 01 | 01 |
| 6 | 0000 0110 | 001 | 110 |
| 7 | 0000 0111 | 001 | 111 |
| 8 | 0000 1000 | 001 | 000 |
| 9 | 0000 1001 | 001 | 001 |
| 10 | 0000 1010 | 001 | 010 |
| 11 | 0000 1011 | 001 | 011 |
| 12 | 0000 1100 | 001 | 100 |
| 13 | 0000 1101 | 001 | 101 |
| Etc. | Etc. | Etc. | Etc. |

In the example shown in Table 1, the N suffix bits match the N LSBs of the binary representation of the symbol, which may provide an advantage as described above in relation to the table shown in FIG. 10. However, in other examples, the suffix bits might not match the LSBs of the binary representation of the symbol, and, for example, may instead increment from zero to $(2^N-1)$ for each value of N.

As another example, an encoding scheme could be used in which a=0 and k=2, such that the entropy encoded data values have an even length with the number of prefix bits being half the number of suffix bits. An example of the prefix and suffix bits which could be used to encode different symbols in this case is given in Table 2.

TABLE 2

| Symbol | Binary Representation of symbol | Prefix | Suffix |
|---|---|---|---|
| 0 | 0000 0000 | 1 | 00 |
| 1 | 0000 0001 | 1 | 01 |
| 2 | 0000 0010 | 1 | 10 |
| 3 | 0000 0011 | 1 | 11 |
| 4 | 0000 0100 | 01 | 0100 |
| 5 | 0000 0101 | 01 | 0101 |
| 6 | 0000 0110 | 01 | 0110 |
| 7 | 0000 0111 | 01 | 0111 |
| 8 | 0000 1000 | 01 | 1000 |
| 9 | 0000 1001 | 01 | 1001 |
| 10 | 0000 1010 | 01 | 1010 |
| 11 | 0000 1011 | 01 | 1011 |
| 12 | 0000 1100 | 01 | 1100 |
| 13 | 0000 1101 | 01 | 1101 |
| Etc. | Etc. | Etc. | Etc. |

In the example shown in Table 2, the 2N suffix bits match the 2N LSBs of the binary representation of the symbol, which may provide an advantage as described above in relation to the table shown in FIG. 10. However, in other examples, the suffix bits might not match the LSBs of the binary representation of the symbol, and, for example, may instead increment from zero to ($2^{2N}-1$) for each value of N.

The choice of which entropy coding scheme to use can be made based on the type of data, which would be chosen based on the probability of the different symbols/data values. For example, image data may be coded using a different entropy coding scheme to other types of data. Ideally a symbol, $S_i$, with probability $P_i$, would have a code length, $L_i$, such that $P_i \approx 2^{-L_i}$. In the examples shown above, the prefixes have a format in accordance with unary coding and comprise a '1' and a variable number of '0's. It is noted that in other examples, the '1's and '0's of the prefix values may be swapped such that the prefixes comprise a '0' and a variable number of '1's. Furthermore, the endianness/bit ordering of the prefix and suffix bit may be altered to that described in the examples above.

The decoded data values from the entropy decoding modules 406 are provided to the corresponding spatial recorrelation modules 404. The spatial recorrelation modules 404 perform the reverse of the spatial decorrelation described above in relation to FIGS. 6 to 9. Details of an example of the operation of a spatial recorrelation module 404 are described with reference to FIGS. 18 and 19.

Figure 18:
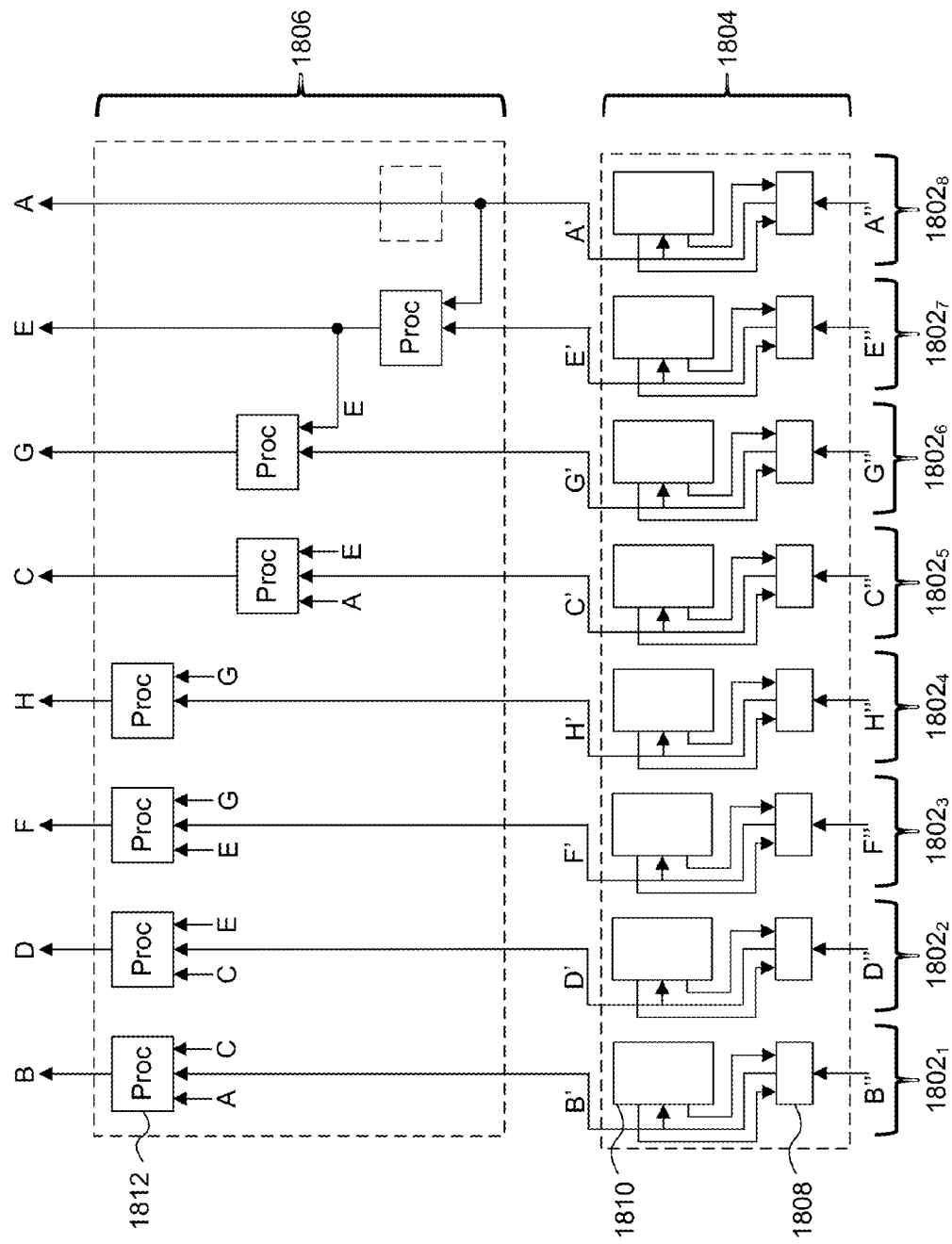
FIG. 18 shows a spatial recorrelation module.

FIG. 18 shows the spatial recorrelation module 404 comprising eight processing pipelines $1802_1$ to $1802_8$, which on each iteration (e.g. each clock cycle), each receive one of the entropy decoded data values from a row of data values (denoted A" to H" in FIG. 18). For the purposes of the spatial recorrelation module the entropy decoded data values are considered to be spatially decorrelated data values on which spatial recorrelation is to be applied to determine spatially recorrelated data values. Each processing pipeline 1802 includes a first stage 1804 and a second stage 1806. Each of the first stages 1804 includes a processing unit 1808 and a store 1810 for performing spatial recorrelation in the vertical dimension (e.g. over columns). Each of the second stages 1806 includes a processing unit 1812 for performing spatial recorrelation in the horizontal dimension (e.g. over rows). In contrast to the encoding pipelines 604 shown in FIG. 6, there is a dependency chain in the second stages 1806 of the decoding pipelines 1802, whereby the second stages 1806 of some of the pipelines 1802 use the results of the second stages 1806 of other pipelines 1802, as described in more detail below.

Figure 19:
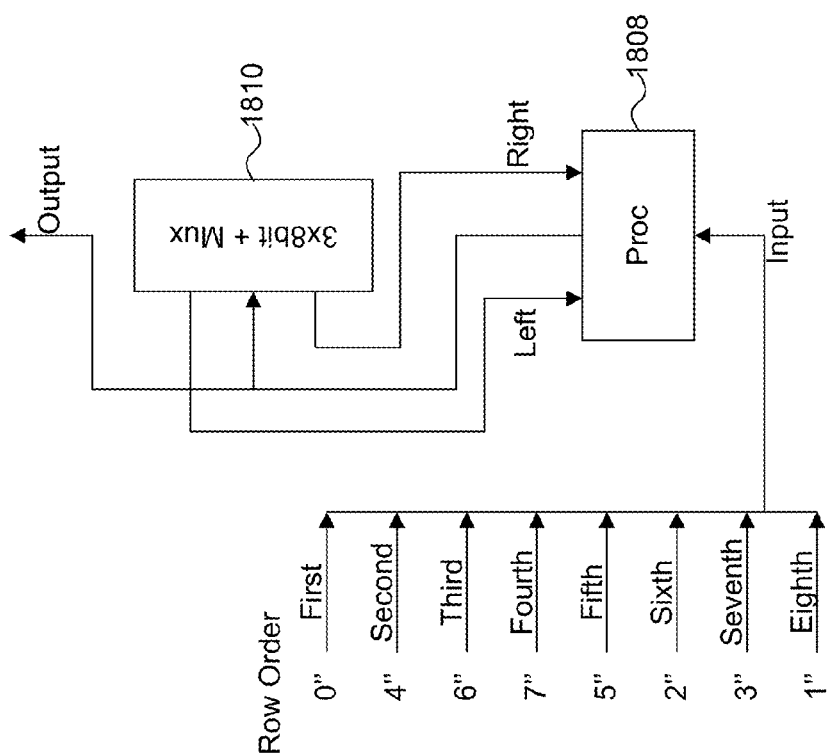
FIG. 19 illustrates the operation of a stage of a processing pipeline of the spatial recorrelation module.

FIG. 19 illustrates the operation of the first stage 1804 of one of the processing pipelines 1802 over eight iterations to thereby output first coefficients to the respective second stages 1806 for an 8×8 block of incoming spatially decorrelated data values. The first stages 1804 of the spatial recorrelation module 404 perform the inverse of the operations performed by the second stages 608 of the corresponding spatial decorrelation module 204. The rows of a block of spatially decorrelated data values are input to the parallel processing pipelines 1802 in an order such that after a first one of the rows has been received by the first stages 1804 and stored in the registers 1810, the first coefficients of each subsequent row of the block that is received at the first stages 1804 can be determined based on the stored first coefficients in the registers 1810. For example, as described in more detail below, the rows of an 8×8 block of spatially decorrelated data values may be supplied to the processing pipelines 1802 in the order: row 0, row 4, row 6, row 7, row 5, row 2, row 3 and then row 1.

It can be seen that the processing unit 1808 has three inputs labelled "Input", "Left" and "Right" in FIG. 19, whereby the spatially decorrelated data values are received on the Input line, whereas the left and right inputs are coupled to outputs of the registers 1810. On a first clock cycle (clock cycle C0), the first stages 1804 of the pipelines 1802 receive the spatially decorrelated data values for row 0 (the spatially decorrelated data value input to the second stage 1804 is indicated in FIG. 19 by a double prime: 0") and output the first coefficients for row 0 (the value output from the second stage 1804 is indicated in FIG. 19 by a single prime: e.g. 0'), wherein the storage units 1810 store the first coefficients for row 0 (i.e. following clock cycle C0, the registers 1810 store the first coefficients for row 0, denoted 0').

On a second clock cycle (clock cycle C1), the first stages 1804 of the pipelines 1802 receive the spatially decorrelated data values for row 4 (the spatially decorrelated data value input to the first stage 1804 is 4") and output the first coefficients for row 4 (the value output from the second stage 608 is 4'). That is, the processing unit 1808 receives 4" on the Input line and receives 0' on the left and right inputs, such that the first coefficients for row 4 (denoted 4') are determined by the processing units 1808 based on the received spatially decorrelated data values for row 4 (denoted 4") and the stored first coefficients for row 0 (denoted 0', retrieved from the registers 1810). As described above, in the spatial decorrelation, the spatially decorrelated values for row 4 are determined as $$4''=4'-0' \bmod 2^8,$$

so rearranging this we get:

$$4'=4''+0' \bmod 2^8.$$

The processing unit 1808 uses this equation to determine the values denoted 4' based on the input values of 4" and the stored first coefficients 0'. Following clock cycle C1 the storage units store the first coefficients for rows 0 and 4 (denoted 0' and 4').

On a third clock cycle (clock cycle C2), the first stages 1804 of the pipelines 1802 receive the spatially decorrelated data values for row 6 (the value input to the second stage 1804 is 6") and output the first coefficients for row 6 (the value output from the second stage 1804 is 6'). That is, the processing unit 1808 receives 6" on the Input line and receives 4' on the left and right inputs, such that the first coefficients for row 6 (denoted 6') are determined by the processing units 1808 based on the received spatially decorrelated data values for row 6 (denoted 6") and the stored first coefficients for row 4 (denoted 4', retrieved from the registers 1810). As will be apparent, the values 6' are determined according to the equation: $6'=6''+4' \bmod 2^8$. Following clock cycle C2 the registers 1810 store the first coefficients for rows 0, 4 and 6, denoted 0', 4' and 6').

As will be apparent, on a fourth clock cycle (clock cycle C3), the first stages 1804 of the pipelines 1802 receive the spatially decorrelated data values for row 7 (denoted 7") and output the first coefficients for row 7 (denoted 7'). That is, the processing unit 1808 receives 7" on the Input line and receives 6' on the left and right inputs. The values 7' are determined according to the equation: $7'=7''+6' \bmod 2^8$. Following clock cycle C3 the registers 1810 store the first coefficients for rows 0, 4 and 6, denoted 0', 4' and 6').

As will be apparent, on a fifth clock cycle (clock cycle C4), the first stages 1804 of the pipelines 1802 receive the spatially decorrelated data values for row 5 (denoted 5") and output the first coefficients for row 5 (denoted 5'). That is, the processing unit 1808 receives 5" on the Input line, receives 4' on the left input and receives 6' on the right input. The values 5' are determined according to the equation: 5'=5"+LPredict(4', 6') mod $2^8$. Following clock cycle C4 the registers 1810 store the first coefficients for rows 0 and 4, denoted 0' and 4'). The first coefficient for row 6 (denoted 6') may be discarded because it is not needed for subsequent rows, but it may be simpler to leave 6' in the registers 1810 until it is overwritten.

The operation of the first stages 1804 on the sixth, seventh and eighth clock cycles will be apparent from FIG. 19 and will follow the same principles as described above for first five clock cycles, and so for conciseness we will not explain the operation in these clock cycles in detail here. It is noted that the storage unit 1810 of each of the first stages 1804 of the processing pipelines 1802 is configured to store up to three first coefficients, and this is sufficient for the processing of all of the rows in the first stages 1804 due to the order in which the rows are input to the spatial recorrelation module 404. As noted above, in general, each of the registers 1810 will have the capacity to store up to $\log_2(r)$ first coefficients at any given time, where r is the number of rows in the block of spatially decorrelated data values.

Therefore, in each iteration, a row of first coefficients (labelled A' to H' in FIG. 18) is provided to the respective second stages 1806 of the processing pipelines 1802. The second stages 1806 of the spatial recorrelation module 404 perform the inverse of the operations performed by the first stages 606 of the corresponding spatial decorrelation module 204.

As described above in the spatial decorrelation, the data values of column A are the same as the first coefficients for column A, i.e. A'=A. Therefore, in the corresponding spatial recorrelation, the first coefficients for column A received at the second stage 1806 of the processing pipeline 1802$_8$ are unchanged on the output of the second stage 1806, i.e. A=A'.

However, as described above in the spatial decorrelation, for column E, the first coefficient E' is given by the equation: E'=E−A mod $2^8$, which can be written as E'=mod$_{2^8}$(E−A) to more clearly show the operation of the mod function. Since A=A', we can arrange the equation to give E=mod$_{2^8}$(E'+A'). Therefore, the processing unit 1812 in the processing pipeline 1802$_7$ outputs the spatially decorrelated data values for column E according to this equation using inputs of A' and E'.

Furthermore, as described above in the spatial decorrelation, for column G, the first coefficient G' is given by the equation: G'=mod$_{2^8}$(G−E). The equation can be re-arranged to give G=mod$_{2^8}$(G'+E). Therefore, the processing unit 1812 in the processing pipeline 1802$_6$ outputs the spatially decorrelated data values for column G according to this equation using inputs of E and G', wherein the value of E is provided from the output of the processing unit 1812 in processing pipeline 1802$_7$. In other embodiments the calculation of E may be repeated in the processing unit 1812 of the processing pipeline 1802$_6$ (as well as in processing pipeline 1802$_7$) such that the processing pipeline 1802$_6$ does not rely on the output of the processing pipeline 1802$_7$. In these other embodiments the processing unit 1812 of the processing pipeline 1802$_6$ may receive the A and E' values as inputs as well as the G' value.

Furthermore, as described above in the spatial decorrelation, for column C, the first coefficient C' is given by the equation: C'=mod$_{2^8}$(C−LPredict(A,E)). Using the definition of LPredict given above, the equation can be re-arranged to give:

$$C = \text{mod}_{2^8}\left(C' + \left\lfloor\frac{A+E}{2}\right\rfloor + \begin{cases} 2^7, & \text{if } |E-A| \geq 2^7 \\ 0, & \text{otherwise} \end{cases}\right).$$

Therefore, the processing unit 1812 in the processing pipeline 1802$_5$ outputs the spatially decorrelated data values for column C according to this equation using inputs of A, C' and E, wherein the value of A is provided from the output of the first stage 1804 of the processing pipeline 1802$_8$, and the value of E is provided from the output of the processing unit 1812 in processing pipeline 1802$_7$. In other embodiments the calculation of E may be repeated in the processing unit 1812 of the processing pipeline 1802$_5$ (as well as in processing pipeline 1802$_7$) such that the processing pipeline 1802$_5$ does not rely on the output of the processing pipeline 1802$_7$, in which case the processing unit 1812 of the processing pipeline 1802$_5$ may receive the E' value as an input as well as the A and C' values.

Furthermore, as described above in the spatial decorrelation, for column B, the first coefficient B' is given by the equation: B'=mod$_{2^8}$(B−LPredict(A,C)). The equation can be re-arranged to give:

$$B = \text{mod}_{2^8}\left(B' + \left\lfloor\frac{A+C}{2}\right\rfloor + \begin{cases} 2^7, & \text{if } |C-A| \geq 2^7 \\ 0, & \text{otherwise} \end{cases}\right).$$

Therefore, the processing unit 1812 in the processing pipeline 1802$_1$ outputs the spatially decorrelated data values for column B according to this equation using inputs of A, B' and C. The value of A is provided from the output of the first stage 1804 of the processing pipeline 1802$_8$, and the value of C is provided from the output of the processing unit 1812 in processing pipeline 1802$_5$. In other embodiments the calculation of C may be repeated in the processing unit 1812 of the processing pipeline 1802$_1$ (as well as in processing pipeline 1802$_5$) such that the processing pipeline 1802$_1$ does not rely on the output of the processing pipeline 1802$_5$, in which case the processing unit 1812 of the processing pipeline 1802$_1$ may receive the C' and E' values as inputs as well as the A and B' values.

Furthermore, as described above in the spatial decorrelation, for column D, the first coefficient D' is given by the equation: D'=mod$_{2^8}$(D−LPredict(C,E)). The equation can be re-arranged to give:

$$D = \text{mod}_{2^8}\left(D' + \left\lfloor\frac{C+E}{2}\right\rfloor + \begin{cases} 2^7, & \text{if } |C-E| \geq 2^7 \\ 0, & \text{otherwise} \end{cases}\right).$$

Therefore, the processing unit 1812 in the processing pipeline 1802$_2$ outputs the spatially decorrelated data values for column D according to this equation using inputs of C, D' and E. The value of C is provided from the output of the processing unit 1812 in processing pipeline 1802$_5$, and the value of E is provided from the output of the processing unit 1812 in processing pipeline 1802$_7$. In other embodiments the calculation of C may be repeated in the processing unit 1812 of the processing pipeline 1802$_2$ (as well as in processing pipeline 1802$_5$) such that the processing pipeline 1802$_2$ does not rely on the output of the processing pipeline 1802$_5$. Furthermore, in these other embodiments, the calculation of E may be repeated in the processing unit 1812 of the processing pipeline 1802$_2$ (as well as in processing pipeline 1802$_7$) such that the processing pipeline 1802$_2$ does not rely on the output of the processing pipeline 1802$_7$. In these other embodiments the processing unit 1812 of the processing pipeline 1802$_2$ may receive the A, C' and E' values as inputs as well as the D' value.

Furthermore, as described above in the spatial decorrelation, for column F, the first coefficient F' is given by the equation: $F'=\mathrm{mod}_{2^8}(F-\mathrm{LPredict}(E,G))$. The equation can be re-arranged to give:

$$F = \mathrm{mod}_{2^8}\left(F' + \left\lfloor \frac{E+G}{2} \right\rfloor + \begin{cases} 2^7, & \text{if } |E-G| \geq 2^7 \\ 0, & \text{otherwise} \end{cases}\right).$$

Therefore, the processing unit 1812 in the processing pipeline 1802$_3$ outputs the spatially decorrelated data values for column F according to this equation using inputs of E, F' and G. The value of E is provided from the output of the processing unit 1812 in processing pipeline 1802$_7$, and the value of G is provided from the output of the processing unit 1812 in processing pipeline 1802$_6$. In other embodiments the calculation of E may be repeated in the processing unit 1812 of the processing pipeline 1802$_3$ (as well as in processing pipeline 1802$_7$) such that the processing pipeline 1802$_3$ does not rely on the output of the processing pipeline 1802$_7$. Furthermore, in these other embodiments, the calculation of G may be repeated in the processing unit 1812 of the processing pipeline 1802$_3$ (as well as in processing pipeline 1802$_6$) such that the processing pipeline 1802$_3$ does not rely on the output of the processing pipeline 1802$_6$. In these other embodiments the processing unit 1812 of the processing pipeline 1802$_3$ may receive the A, E' and G' values as inputs as well as the F' value.

Furthermore, as described above in the spatial decorrelation, for column H, the first coefficient H' is given by the equation: $H'=\mathrm{mod}_{2^8}(H-G)$. The equation can be re-arranged to give $H=\mathrm{mod}_{2^8}(H'+G)$. Therefore, the processing unit 1812 in the processing pipeline 1802$_4$ outputs the spatially decorrelated data values for column H according to this equation using inputs of G and H', wherein the value of G is provided from the output of the processing unit 1812 in processing pipeline 1802$_6$. In other embodiments the calculation of G may be repeated in the processing unit 1812 of the processing pipeline 1802$_4$ (as well as in processing pipeline 1802$_6$) such that the processing pipeline 1802$_4$ does not rely on the output of the processing pipeline 1802$_6$. In these other embodiments the processing unit 1812 of the processing pipeline 1802$_4$ may receive the A and E' values as inputs as well as the H' value.

In this way, the spatial recorrelation module 404 can determine a row of spatially recorrelated data values on each of a plurality of iterations (e.g. clock cycles). For example, an 8×8 block of data values can be determined in eight iterations.

As described above, colour recorrelation is then performed by the colour recorrelation modules 402 on the data values of the R, G and B channels output from the spatial recorrelation modules 404, to thereby obtain the decompressed data values.

There have been described above methods and systems for data compression and decompression wherein a predictable number of data values can be compressed and decompressed on each of a plurality of consecutive clock cycles. In the examples described in detail above, the data values have ARGB 8:8:8:8 format (such that there are four colour channels, each having eight-bit data values) and the blocks of data are 8×8 blocks of data. In other examples, other colour formats may be used (e.g. ARGB 2:10:10:10, in which the Alpha channel data values have 2 bits and the Red, Green and Blue channel data values have 10 bits) and/or other sizes of data blocks may be used (e.g. 4×16, 2×32, 16×16, etc.). A person skilled in the art would be able to apply the principles described above to other colour formats and/or other sizes of data blocks.

Furthermore, the above description of the "rows" and "columns" of the data block is not limiting in the sense that in other examples the columns of data blocks could be processed as the rows are processed in the examples described above, and the rows of data blocks could be processed as the columns are processed in the examples described above.

Generally, any of the functions, methods, techniques or components described above can be implemented in modules using software, firmware, hardware (e.g., fixed logic circuitry), or any combination of these implementations. The terms "module," "functionality," "component", "block", "unit" and "logic" may be used herein to generally represent software, firmware, hardware, or any combination thereof.

In the case of a software implementation, the module, functionality, component or logic represents program code that performs specified tasks when executed on a processor (e.g. one or more CPUs). In one example, the methods described may be performed by a computer configured with software in machine readable form stored on a computer-readable medium. One such configuration of a computer-readable medium is signal bearing medium and thus is configured to transmit the instructions (e.g. as a carrier wave) to the computing device, such as via a network. The computer-readable medium may also be configured as a computer-readable storage medium and thus is not a signal bearing medium. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The software may be in the form of a computer program comprising computer program code for configuring a computer to perform the constituent portions of described methods or in the form of a computer program comprising computer program code means adapted to perform all the steps of any of the methods described herein when the program is run on a computer and where the computer program may be embodied on a computer readable medium. The program code can be stored in one or more computer readable media. The features of the techniques described herein are platform-independent, meaning that the techniques may be implemented on a variety of computing platforms having a variety of processors.

Those skilled in the art will also realize that all, or a portion of the functionality, techniques or methods may be carried out by a dedicated circuit, an application-specific integrated circuit, a programmable logic array, a field-programmable gate array, or the like. For example, the module, functionality, component or logic may comprise hardware in the form of circuitry. Such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnects, by way of example. Such elements may be provided as custom circuits or standard cell libraries, macros, or at other levels of abstraction. Such elements may be interconnected in a specific arrangement. The module, functionality, component or logic may include circuitry that is fixed function and circuitry that can be programmed to perform a function or functions; such programming may be provided from a firmware or software update or control mechanism. In an example, hardware logic has circuitry that implements a fixed function operation, state machine or process.

It is also intended to encompass software which "describes" or defines the configuration of hardware that implements a module, functionality, component or logic described above, such as HDL (hardware description language) software, as is used for designing integrated circuits, or for configuring programmable chips, to carry out desired functions. That is, there may be provided a computer readable storage medium having encoded thereon computer readable program code for generating a processing unit configured to perform any of the methods described herein, or for generating a processing unit comprising any apparatus described herein. That is, a computer system may be configured to generate a representation of a digital circuit from definitions of circuit elements and data defining rules for combining those circuit elements, wherein a non-transitory computer readable storage medium may have stored thereon processor executable instructions that when executed at such a computer system, cause the computer system to generate entropy encoding/decoding modules as described herein. To put it another way, there may be provided a non-transitory computer readable storage medium having stored thereon computer readable instructions that, when processed at a computer system for generating a manifestation of an integrated circuit, cause the computer system to generate a manifestation of an entropy encoding module or an entropy decoding module according to any of the examples described herein.

The term 'processor' and 'computer' are used herein to refer to any device, or portion thereof, with processing capability such that it can execute instructions, or a dedicated circuit capable of carrying out all or a portion of the functionality or methods, or any combination thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. It will be understood that the benefits and advantages described above may relate to one example or may relate to several examples.

Any range or value given herein may be extended or altered without losing the effect sought, as will be apparent to the skilled person. The steps of the methods described herein may be carried out in any suitable order, or simultaneously where appropriate. Aspects of any of the examples described above may be combined with aspects of any of the other examples described to form further examples without losing the effect sought.

The invention claimed is:

1. An entropy decoding module configured to perform entropy decoding on a sequence of entropy encoded data values, wherein the entropy encoded data values have been encoded according to a predetermined variable-length entropy coding scheme such that each of the entropy encoded data values comprises one or more first bits and zero or more second bits, wherein for each of the encoded data values the number of first bits is related to the number of second bits according to a predetermined relationship of the entropy coding scheme, and wherein each of a plurality of bit locations in the sequence of entropy encoded data values is predetermined by the entropy coding scheme to include either a first bit or a second bit, the entropy decoding module being configured to:

receive the sequence of entropy encoded data values;

separate the first bits of the received entropy encoded data values from the second bits of the received entropy encoded data values based on the bit locations of the bits in the sequence of entropy encoded data values in accordance with the entropy coding scheme;

analyse the separated first bits of the received entropy encoded data values to determine bit-boundaries between the received entropy encoded data values in accordance with the predetermined relationship between the number of first bits and the number of second bits for each of the received encoded data values; and use the second bits and the determined bit-boundaries to decode the entropy encoded data values in accordance with the predetermined variable-length entropy coding scheme.

2. The entropy decoding module of claim 1 wherein the bit locations in the sequence of entropy encoded data values are predetermined such that, for encoded data values comprising one or more of said second bits, at least some of the first bits are interleaved with the second bits according to a predetermined interleave format of the entropy coding scheme, and wherein the entropy decoding module is further configured to separate the first bits from the second bits by de-interleaving the interleaved first and second bits of the received entropy encoded data values in accordance with the predetermined interleave format.

3. The entropy decoding module of claim 1 comprising a plurality of parallel decode units and one or more merging units, wherein the entropy decoding module is configured to analyse the first bits by:

splitting the first bits into a plurality of sections and providing the sections to respective ones of the parallel decode units; and analysing the sections in the decode units to determine the bit-boundaries within the sections and outputting results of the analysis from the decode units to the one or more merging units.

4. The entropy decoding module of claim 3 wherein the decode units are configured to output carry out bits if first bits of encoded data values are present, but do not finish, within a respective one of the sections, the carry out bits being for use by the one or more merging units in combining the results of the analysis of each of the sections to determine the entropy decoded data values.

5. The entropy decoding module of claim 3 wherein there are seven of said parallel decode units, and wherein said one or more merging units comprises three first-level merging units, two second-level merging units and one third-level merging unit, wherein:

each of the first-level merging units is configured to receive and combine the results of the analysis output from a respective pair of the decode units, one of the second-level merging units is configured to receive and combine results output from two of the first-level merging units, the other second-level merging unit is configured to receive and combine results output from the remaining first-level merging unit and the remaining decode unit, and the third-level merging unit is configured to receive and combine results output from the second-level merging units.

6. The entropy decoding module of claim 1 wherein the entropy encoded data values are from a block of entropy encoded data values, and wherein the entropy decoding module is configured to decode the entropy encoded data values from a line of the block on each of a plurality of iterations.

7. The entropy decoding module of claim 2 wherein the entropy encoded data values are from a block of entropy encoded data values, and wherein the entropy decoding module is configured to decode the entropy encoded data values from a line of the block on each of a plurality of iterations, and wherein for each of the entropy encoded data values the number of first bits is one greater than the number of second bits, and wherein according to the predetermined interleave format, for each line of entropy encoded data values, one of the first bits from each of the encoded data values in the line are grouped together into a first field, and the remaining first and second bits of each of the encoded data values in the line are interleaved in an alternating manner in a second field, wherein the entropy decoding module is configured to de-interleave the interleaved first and second bits of the received entropy encoded data values by splitting the odd bits of the second field from the even bits of the second field to thereby form a stream of first bits and a corresponding stream of second bits.

8. The entropy decoding module of claim 1 wherein the entropy decoding module is configured to determine the bit-boundaries between the received entropy encoded data values without analysing the second bits of the received entropy encoded data values.

9. The entropy decoding module of claim 1 wherein the first bits have a format in accordance with unary coding, and wherein the second bits are binary bits.

10. The entropy decoding module of claim 1 wherein the first bits are prefix bits and the second bits are suffix bits of the entropy encoded data values.

11. A non-transitory computer readable storage medium having stored thereon computer readable instructions that, when processed at a computer system for generating a manifestation of an integrated circuit, cause the computer system to generate a manifestation of an entropy decoding module configured to perform entropy decoding on a sequence of entropy encoded data values, wherein the entropy encoded data values have been encoded according to a predetermined variable-length entropy coding scheme such that each of the entropy encoded data values comprises one or more first bits and zero or more second bits, wherein for each of the encoded data values the number of first bits is related to the number of second bits according to a predetermined relationship of the entropy coding scheme, and wherein each of a plurality of bit locations in the sequence of entropy encoded data values is predetermined by the entropy coding scheme to include either a first bit or a second bit, the entropy decoding module being configured to:

receive the sequence of entropy encoded data values;

separate the first bits of the received entropy encoded data values from the second bits of the received entropy encoded data values based on the bit locations of the bits in the sequence of entropy encoded data values in accordance with the entropy coding scheme;

analyse the separated first bits of the received entropy encoded data values to determine bit-boundaries between the received entropy encoded data values in accordance with the predetermined relationship between the number of first bits and the number of second bits for each of the received encoded data values; and use the second bits and the determined bit-boundaries to decode the entropy encoded data values in accordance with the predetermined variable-length entropy coding scheme.

12. An entropy encoding module configured to perform entropy encoding on a plurality of data values to form a sequence of entropy encoded data values according to a predetermined variable-length entropy coding scheme, the entropy encoding module being configured to:

receive the data values;

determine, for each of the received data values, an entropy encoded data value according to the entropy coding scheme, whereby the entropy encoded data values comprise one or more first bits and zero or more second bits, wherein for each of the encoded data values the number of first bits is related to the number of second bits according to a predetermined relationship of the entropy coding scheme; and form the sequence of entropy encoded data values from the determined entropy encoded data values, wherein each of a plurality of bit locations in the sequence of entropy encoded data values is predetermined by the entropy coding scheme to include either a first bit or a second bit.

13. The entropy encoding module of claim 12 configured to form the sequence of entropy encoded data values by:

interleaving, for encoded data values comprising one or more of said second bits, at least some of the first bits with the second bits according to a predetermined interleave format of the entropy coding scheme.

14. The entropy encoding module of claim 12 wherein the data values are from a block of data values, and wherein the entropy encoding module comprises a plurality of first encode units configured to:

receive the respective data values from a line of the block;

determine the second bits of the entropy encoded data values of the line; and determine an indication of the size of each of the entropy encoded data values of the line.

15. The entropy encoding module of claim 14 configured to form the sequence of entropy encoded data values by interleaving, for encoded data values comprising one or more of said second bits, at least some of the first bits with the second bits according to a predetermined interleave format of the entropy coding scheme, wherein the entropy encoding module further comprises one or more second encode units configured to:

receive the second bits and the indications of the sizes of the entropy encoded data values of the line;

determine first bits of the entropy encoded data values of the line based on the received indications of the sizes of the entropy encoded data values; and interleave the determined first bits with the received second bits of the entropy encoded data values.

16. The entropy encoding module of claim 15 further comprising a processing unit configured to:

receive the indications of the sizes of the entropy encoded data values of the line;

determine one of the first bits of each of the entropy encoded data values of the line based on the received indications of the sizes of the entropy encoded data values; and group said one of the first bits from each of the encoded data values in the line together into a first field in accordance with the predetermined interleave format.

17. The entropy encoding module of claim 16 wherein for each of the entropy encoded data values the number of first bits is one greater than the number of second bits, and wherein the second encode units are configured to interleave the first bits, which are not grouped into the first field, with the received second bits of the entropy encoded data values in an alternating manner.

18. The entropy encoding module of claim 12 further comprising a data store configured to store the entropy encoded data values.

19. The entropy encoding module of claim 12 further comprising an encoding indicator unit configured to set an indicator to indicate the coding scheme used to encode the data values.

20. A non-transitory computer readable storage medium having stored thereon computer readable instructions that, when processed at a computer system for generating a manifestation of an integrated circuit, cause the computer system to generate a manifestation of an entropy encoding module configured to perform entropy encoding on a plurality of data values to form a sequence of entropy encoded data values according to a predetermined variable-length entropy coding scheme, the entropy encoding module being configured to:
   receive the data values;
   determine, for each of the received data values, an entropy encoded data value according to the entropy coding scheme, whereby the entropy encoded data values comprise one or more first bits and zero or more second bits, wherein for each of the encoded data values the number of first bits is related to the number of second bits according to a predetermined relationship of the entropy coding scheme; and
   form the sequence of entropy encoded data values from the determined entropy encoded data values, wherein each of a plurality of bit locations in the sequence of entropy encoded data values is predetermined by the entropy coding scheme to include either a first bit or a second bit.

* * * * *